United States Patent [19]

Tsutsumi et al.

[11] Patent Number: 6,121,860

[45] Date of Patent: Sep. 19, 2000

[54] MULTIMODE SURFACE ACOUSTIC WAVE FILTER WITH A COUPLING SECTION NOT BEING A UNIFORM METAL FILM

[75] Inventors: Jun Tsutsumi; Osamu Ikata; Yoshio Satoh, all of Kawasaki, Japan

[73] Assignee: Fujitsu Limited, Kawasaki, Japan

[21] Appl. No.: 08/831,332

[22] Filed: Mar. 31, 1997

[30] Foreign Application Priority Data

May 14, 1996 [JP] Japan ................................. 8-119122
Jan. 16, 1997 [JP] Japan ................................. 9-005675

[51] Int. Cl.⁷ ........................................ H03H 9/64
[52] U.S. Cl. .................................... 333/195; 310/313 D
[58] Field of Search .................................. 333/193–196; 310/313 R, 313 B, 313 C, 313 D

[56] References Cited

U.S. PATENT DOCUMENTS

| Re. 33,957 | 6/1992 | Nakazawa et al. | 310/313 D X |
| 4,810,920 | 3/1989 | Yamamoto | 310/313 C X |
| 4,999,535 | 3/1991 | Mariani et al. | 333/151 D X |
| 5,374,908 | 12/1994 | Wright | 310/313 X |

FOREIGN PATENT DOCUMENTS

| 2-81511 | 3/1990 | Japan | 333/195 |
| 4-81012 | 3/1992 | Japan | 333/193 |
| 6-177698 | 6/1994 | Japan | 333/193 |
| 6-232687 | 8/1994 | Japan |  |

Primary Examiner—Robert Pascal
Assistant Examiner—Barbara Summons
Attorney, Agent, or Firm—Staas & Halsey LLP

[57] ABSTRACT

The multimode surface acoustic wave filter includes two surface acoustic wave resonators closely arranged on a piezoelectric substrate in a direction perpendicular to the propagation direction of surface acoustic waves and acoustically coupled by a coupling section, each of the surface acoustic wave resonators including an interdigital transducer and two reflectors disposed closely on both sides of the interdigital transducer in a direction parallel to the propagation direction of the surface acoustic waves, the interdigital transducer having an excitation section for exciting the surface acoustic waves and a signal terminal section for inputting an electric signal, each of the reflectors having a grating section and a terminal section, wherein the velocity of surface acoustic waves propagating through the coupling section is a little larger than the velocity of the surface acoustic waves propagating through the excitation section of the interdigital transducer.

49 Claims, 23 Drawing Sheets

A portion of the common bus bar has a grating structure

The common bus bar is made of uniform metal film

Signal-side bus bar
has a grating structure

Signal-side bus bar is made
of a uniform metal film

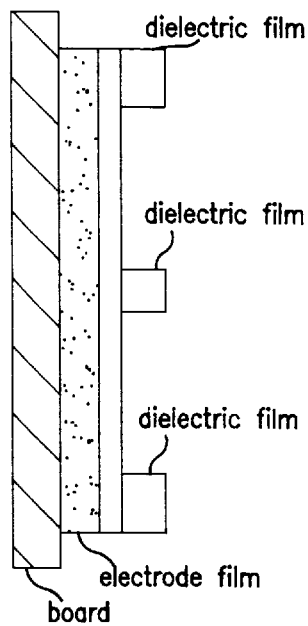
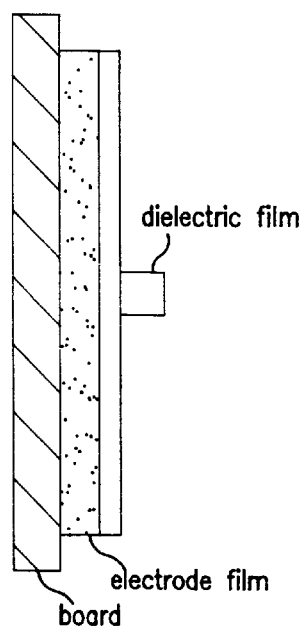
FIG. 13a          FIG. 13b
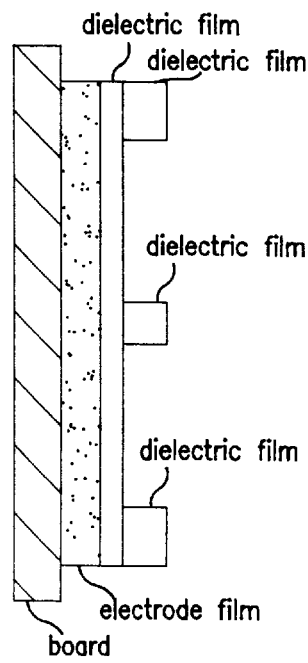
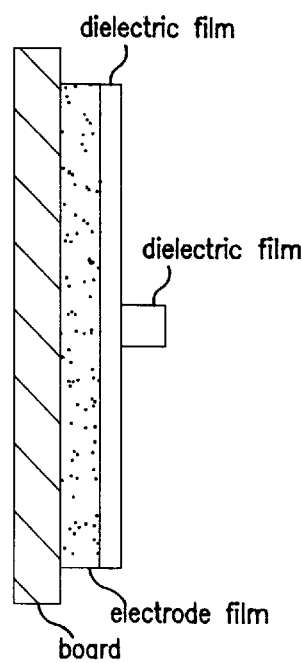
FIG. 14a          FIG. 14b At-cut quartz board ST-cut quartz board

MULTIMODE SURFACE ACOUSTIC WAVE FILTER WITH A COUPLING SECTION NOT BEING A UNIFORM METAL FILM

BACKGROUND OF THE INVENTION

1. Field of the Invention

The present invention relates to a multimode surface acoustic wave filter, especially a transverse-coupling type multimode filter. More particularly, the present invention relates to a transverse-coupling type multimode filter wherein surface acoustic wave resonators utilizing an IDT (Interdigital Transducer) are arranged in a direction perpendicular to the propagation direction of the surface acoustic wave.

2. Description of the Related Art

Recently, surface acoustic wave filters are used in mobile communication terminals such as portable telephones because they have a small size and low device height, and can achieve sharp filter characteristics.

Among the surface acoustic wave filters, the transverse-coupling type multimode filters have characteristics suitable as narrow bandpass filters. Especially, use of quartz substrates has realized narrow bandpass filters which are excellent in temperature stability and with a relative bandwidth of about 0.05%.

Moreover, transverse-coupling type multimode filters are used as an IF (Intermediate Frequency) filter for portable telephones because they involve a small occurrence of spurious response outside the passband.

However, mobile communication terminals including digital cordless telephones such as a PHS which have recently come into service require a filter having a relative bandwidth of about 0.1% and good temperature stabilty in accordance with the digitization of the system.

In order to realize a filter having a relative bandwidth of about 0.1%, there are two conventional methods such as the following.

One method is to use a piezoelectric substrate having good temperature stabilty and a large electromechanical coupling coefficient. The other method is to employ a complicated filter construction other than a transverse-coupling type multimode filter by using a quartz substrate. An example thereof is a composite longitudinal mode resonator filter such as disclosed in Japanese Unexamined (Kokai) Patent Publication No. Hei 6(1994)-232687.

The only substrate material that is now available and that has good temperature stability and a large electromechanical coupling coefficient attaining the above-mentioned design as required is one made of $Li_2B_4O_7$.

However, $Li_2B_4O_7$ has a larger temperature coefficient of second order relative to the surface acoustic wave than a quartz substrate and is prone to corrosion by water, rendering it difficult to manufacture the filters.

The composite longitudinal mode resonator filters as disclosed in the above-mentioned Japanese Unexamined Patent Publication No. Hei 6(1994)-232687 are constructed to include two IDTs and reflectors on both sides thereof, so that the filter size is large and unnecessary spurious responses outside the passband are generated in a considerably large amount, thereby causing noises.

SUMMARY OF THE INVENTION

The present invention provides a multimode surface acoustic wave filter comprising two surface acoustic wave resonators closely arranged on a piezoelectric substrate in a direction perpendicular to the propagation direction of surface acoustic waves and acoustically coupled by a coupling section, each of the surface acoustic wave resonators comprising an interdigital transducer and two reflectors disposed closely on both sides of the interdigital transducer in a direction parallel to the propagation direction of the surface acoustic waves, the interdigital transducer having an excitation section for exciting the surface acoustic waves and a signal terminal section for inputting an electric signal, and each of the reflectors having a reflector section and a terminal section, wherein the velocity of surface acoustic waves propagating through the coupling section is a little larger than the velocity of the surface acoustic waves propagating through the excitation section of the interdigital transducer.

In a case where the coupling section is formed with a metal electrode having a plurality of slits arranged in the propagation direction of the surface acoustic waves, it is possible to obtain a multimode surface acoustic wave filter having a relative bandwidth of about 0.1% suitable as an IF filter for PHS and the like.

Also, in a case where a portion of the signal terminal section in the interdigital transducer is formed with a metal electrode having a plurality of slits arranged in the propagation direction of the surface acoustic waves, it is possible to obtain a multimode surface acoustic wave filter with repressed spurious response on the high frequency side.

BRIEF DESCRIPTION OF THE DRAWINGS

FIG. 13 is a view for showing a construction of the third embodiment of multimode surface acoustic wave filter according to the present invention.

FIG. 14 is a view for showing a construction of the third embodiment of multimode surface acoustic wave filter according to the present invention.

DETAILED DESCRIPTION OF THE PREFERRED EMBODIMENTS

Figure 1:
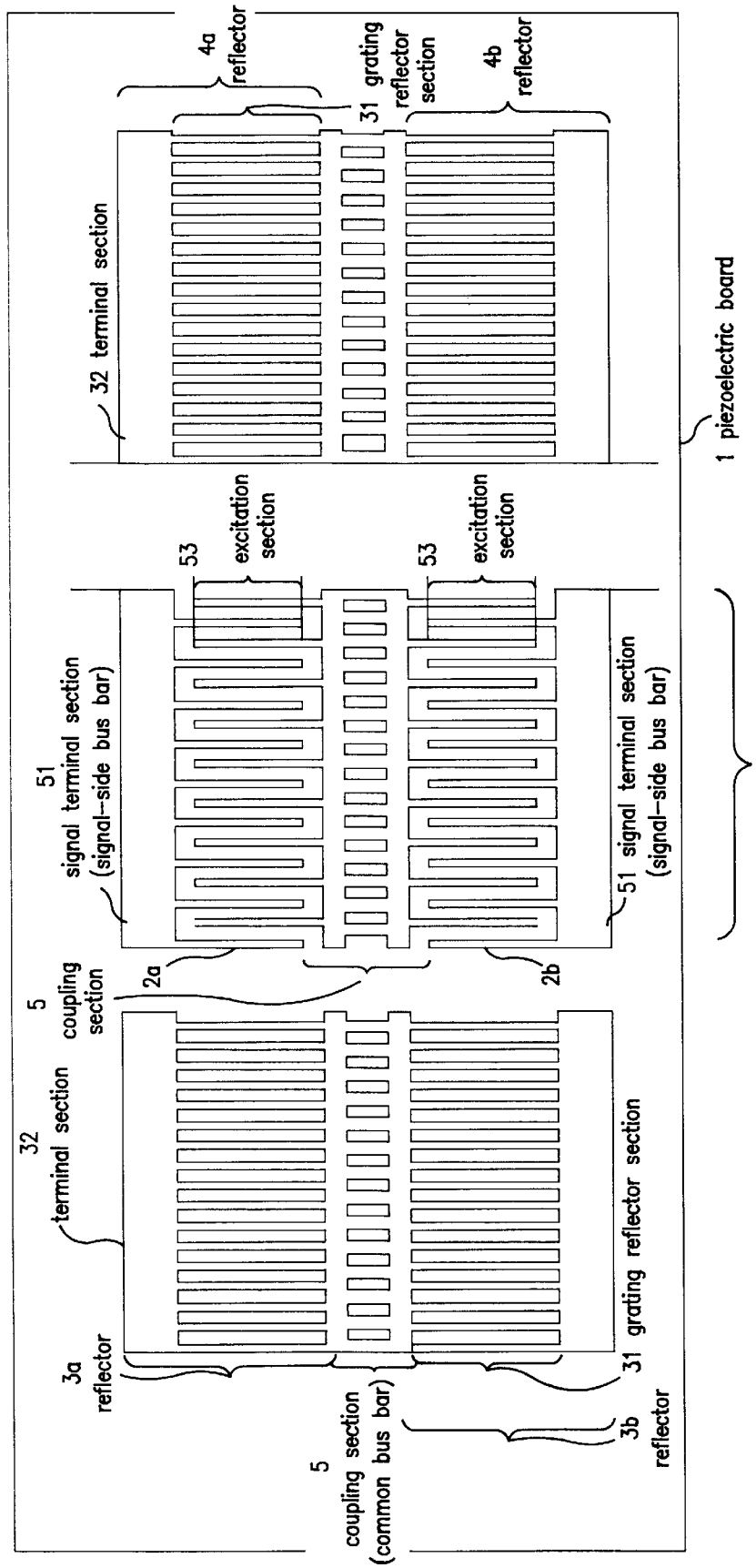
FIG. 1 is a view for showing a construction of a first embodiment of multimode surface acoustic wave filter according to the present invention.

The present invention has been made in view of the above circumstances and the purpose thereof is to provide a multimode surface acoustic wave filter of transverse-coupling type in order to obtain a filter with a simple construction having a relative bandwidth of about 0.1% and involving a small occurrence of spurious response outside the passband.

Also, the purpose of the present invention is to enlarge the bandwidth and to suppress spurious response by adjusting the relationship among the velocities of the surface acoustic waves propagating through the constituent portions of the multimode surface acoustic wave filter of transverse-coupling type.

The above-described interdigital transducer (hereinafter referred to as "IDT") is formed of an excitation section and a signal terminal section, as described before. Usually, a metal material such as aluminum (Al), gold (Au), copper (Cu), titanium (Ti), or the like is used for the excitation section and the signal terminal section. The excitation section of an IDT is formed of a plurality of equally spaced electrode fingers in the same manner as in a conventionally used IDT.

The electrode fingers consist of interdigital electrodes electrically connected to the signal terminal section and interdigital electrodes electrically connected to the coupling section. These interdigital electrodes are alternately arranged and equally spaced to form the excitation section for exciting the surface acoustic waves.

The width of the electrode fingers may be equal to the spacing between the electrode fingers, which may be, for example, 3.2 $\mu$m.

The coupling section may also be formed with a metal material (Al, Au, Cu, Ti, or the like) similar to those for the excitation section or for the signal terminal section. Alternatively, however, a metal material different from the one for the excitation section may be used. For example, Al may be used for the excitation section, and Au may be used for the coupling section and the signal terminal section.

The slits in the coupling section are spaces arranged in an interdigital configuration having a width in the propagation direction of surface acoustic waves and being long and narrow in the direction perpendicular to the propagation direction. In the slit portion, the surface of the piezoelectric substrate is exposed to air.

In view of the filter efficiency, the slits in the coupling section are arranged preferably with equal spacing in the propagation direction of the surface acoustic wave. The slits formed in the signal terminal section may also have the same structure as the coupling section.

Further, the multimode surface acoustic wave filter of the present invention may be constructed in such a manner that the excitation section of the interdigital transducer consists of a plurality of equally spaced electrode fingers and that the ratio (a/b) of the slit interval (a) to the slit width (b) of the coupling section is larger than the ratio (d/c) of the width (d) to the interval (c) of the electrode fingers. For example, if (c)=(d)=3.2 $\mu$m, (a) and (b) may be such that approximately (a)=4.8 $\mu$m and (b)=1.6 $\mu$m.

The coupling section may consist of two grounded electrode sections electrically insulated from each other and a plurality of floating electrodes disposed in a space between these two electrode sections and electrically insulated from each other, the floating electrodes being arranged in the propagation direction of the surface acoustic waves.

Here, the two electrode sections and the floating electrodes constituting the coupling section may be formed of a metal material (Al, Au, Cu, Ti, or the like) similar to the one for the previously mentioned coupling section.

The floating electrodes may have a structure similar to the slits in the previously mentioned coupling section. In other words, the floating electrodes may have a constant width in the propagation direction of the surface acoustic waves, have a certain long and narrow shape in the direction perpendicular to the propagation direction, and be equally spaced in the propagation direction of the surface acoustic waves.

Further, the multimode surface acoustic wave filter having the floating electrodes may be constructed in such a manner that the excitation section of the interdigital transducer consists of a plurality of equally spaced electrode fingers and that the ratio (e/f) of the width (e) to the interval (f) of the floating electrodes is larger than the ratio (d/c) of the width (d) to the interval (c) of the electrode fingers.

EXAMPLES

The present invention will be hereinafter explained in detail based on the following examples in conjunction with the attached drawings. The examples and the drawings are not to be construed as being intended to limit the scope of the present invention.

Example 1

FIG. 1 is a view for showing a construction of a first embodiment of multimode surface acoustic wave filter according to the present invention.

Referring to FIG. 1, rectangle 1 represents a piezoelectric substrate, which has a size of about 2.0 mm×5.0 mm. The multimode surface acoustic wave filter of the present invention is a filter belonging to a class of what is called a transverse-coupling type, wherein two surface acoustic wave resonators are disposed on a piezoelectric substrate in a direction perpendicular to the propagation direction of surface acoustic waves.

One surface acoustic wave resonator includes an interdigital transducer (IDT) 2a disposed at the center and reflectors 3a, 4a disposed closely on both sides of the IDT 2a in the horizontal direction relative to the document sheet, that is, in the direction parallel to the propagation direction of the surface acoustic wave.

In the same manner, the other surface acoustic wave resonator includes an IDT 2b and reflectors 3b, 4b disposed on both sides thereof.

Here, each of the IDTs (2a, 2b) includes an excitation section 53, 54 and a signal terminal section 51, 52. The excitation section 53, 54 includes upper interdigital electrodes (also referred to as electrode fingers) extending from the upper side to the lower side relative to the document sheet and lower interdigital electrodes extending from the lower side to the upper side. The upper electrodes and the lower electrodes are arranged alternately with equal spacing. The signal terminal section 51, 52 has a long and narrow shape in the horizontal direction relative to the document sheet and electrically connects the upper electrodes. The excitation section is a section for exciting surface acoustic waves in the horizontal direction relative to the document sheet.

Each of the reflectors 3a, 4a, 3b, 4b includes a grating section 31 and a terminal section 32, as is the case in IDT. The "grating section" 31 corresponds to the "excitation section" 53, 54 of IDT, and the "terminal section" 32 corresponds to the "signal terminal section" 51, 52 of IDT.

The grating section 31 of the reflector includes long and narrow electrodes of equal length extending in the vertical direction relative to the document sheet and being electrically connected at the terminal section 32. The terminal section 32 of the reflector may have a shape similar to the signal terminal section 51 of IDT.

Here, one of the signal terminal sections of IDT is a terminal at which electric signals are actually inputted. The other of the signal terminal sections of IDT is a terminal for outputting the electric signals obtained from the excited surface acoustic waves.

The signal terminal sections 51, 52 of IDT and the terminal sections 32 of the reflector are also referred to as "signal-side bus bars". These two surface acoustic wave resonators are acoustically coupled with a coupling section 5 formed of metal electrodes. The coupling section 5 is referred to as a "common bus bar".

Referring to FIG. 1, the common bus bar 5 lies between the two surface acoustic wave resonators and is electrically connected to the metal electrodes of the excitation section 53, 54 of IDT and the grating section 31 of the reflector. The common bus bar has a grating structure of metal strips.

Here, the grating structure includes long and narrow slits with constant width arranged with equal spacing in the horizontal direction relative to the document sheet and in the vicinity of the central portion of the common bus bar 5, wherein metal electrodes are arranged in a interdigital configuration. Both of the ends in the vertical direction of the common bus bar 5 is electrically connected to each of the electrodes of the excitation section 53, 54. It is sufficient that the width of the common bus bar 5 in the vertical direction is about several times as large as the electrode period of IDT.

The slits are spaces without electrodes, at which the underlying piezoelectric substrate is exposed to air. The interval of the slits need not be constant.

The width of the slits and the width of the metal electrodes between the slits may both be 3.2 μm, such as in the case of interdigital electrodes of the excitation section in IDT. However, the width (a) of the metal electrodes is preferably larger than the width (b) of the slits due to the reasons described afterwards. Alternatively, the ratio (a/b) of the width (a) of the metal electrodes to the width (b) of the slits is preferably larger than the ratio (dic) of the width (d) of the interdigital electrodes to the interval (c) of the interdigital electrodes of IDT.

For example, the width (a) of the metal electrodes is preferably 4.8 μm, and the width (b) of the slits is preferably 1.6 μm.

Here, the piezoelectric substrate may be formed of a material capable of generating surface acoustic waves on the surface thereof when an electric signal is applied to the metal electrodes. Although it is possible to utilize $Li_2B_4O_7$ which has been conventionally used, it is preferable to use quartz which shows excellent temperature stability.

Among the piezoelectric substrates utilizing a quartz, it is preferable to use a rotated Y-cut quartz such as an ST-cut quartz, an AT-cut quartz, or the like in view of the temperature stability.

Each constituent element of the surface acoustic wave resonator is formed of a metal material. However, in view of band characteristics of the filters, it is preferable to use a metal having a relatively small resistivity, such as Al, Au, Cu, or the like. Especially among these, Al is preferably used in view of electric conductivity and anti-corrosion properties.

In the above transverse-coupling type multimode surface acoustic wave filter as shown in FIG. 1, surface acoustic waves are generated in the horizontal direction relative to the document sheet on the interdigital electrodes of the excitation section 2a when an electric signal is inputted to the signal terminal section (the signal-side bus bar) of the upper surface acoustic wave resonator.

By acoustic coupling, surface acoustic waves are generated in the horizontal direction relative to the document sheet on the interdigital electrodes of the excitation section 2b of the lower surface acoustic wave resonator. The generated surface acoustic waves are outputted as electric signals from the lower signal terminal section (the signal-side bus bar).

The first embodiment of the present invention is characterized in that the "coupling section" is formed to have a grating structure.

The grating (interdigital) structure of the coupling section achieves a lower propagation velocity of the surface acoustic waves propagating through the coupling section than in the case of a uniform metal film, thereby reducing the difference in propagation velocity of the surface acoustic waves propagating through the region of interdigital electrode sections in IDT and through the region of the coupling section. Accordingly, the acoustic coupling between the two surface acoustic wave resonators is strengthened, so that it is possible to manufacture a filter having a desired relative bandwidth to satisfy a requirement that a passband width should be enlarged.

Hereinafter, the principle of operation of the transverse-coupling type multimode filters will be explained.

Figure 3:
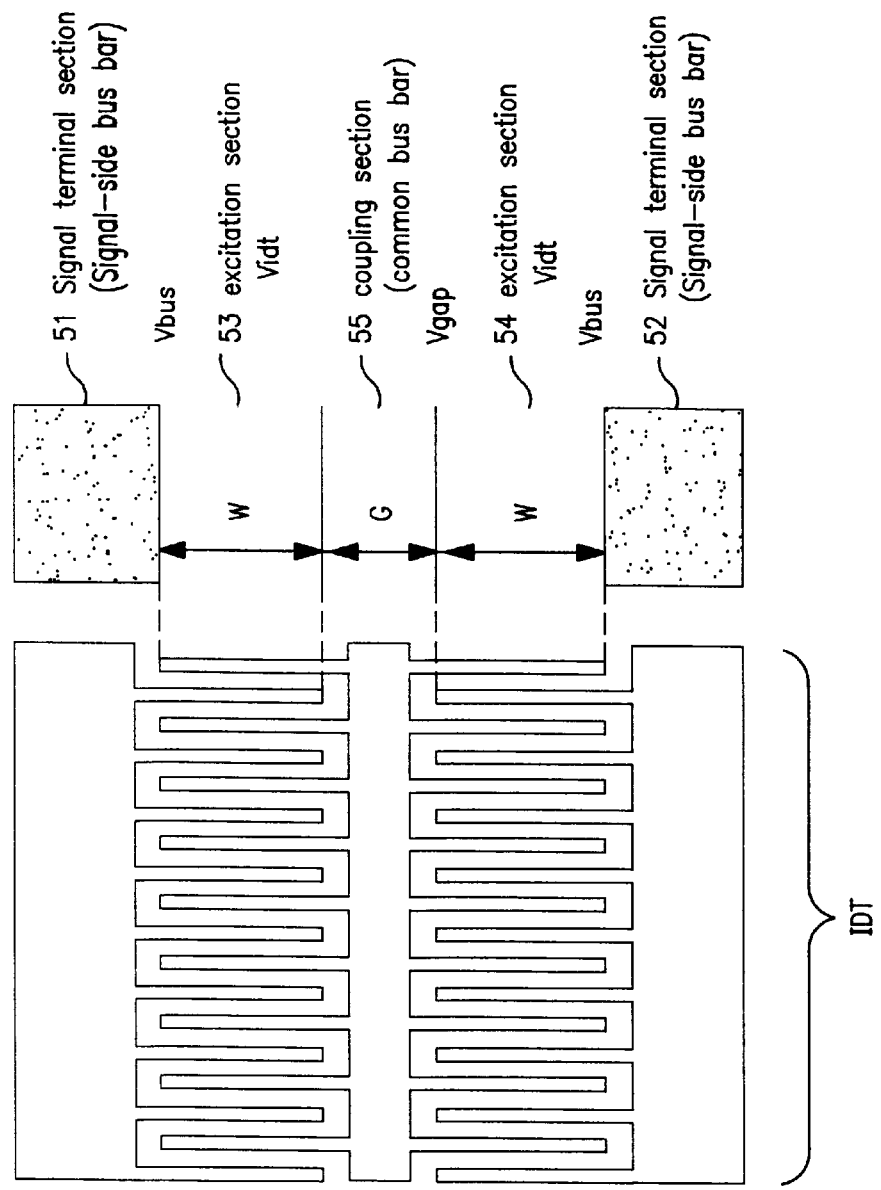
FIG. 3 is a view for explaining the principle of transverse-coupling type multimode filter.

FIG. 3 shows a portion of the transverse-coupling type multimode filter.

The filter includes two surface acoustic wave resonators (the signal-side bus bar 51 and the excitation section 53, the signal-side bus bar 52 and the excitation section 54) and a coupling section 55 (the common bus bar), as in the case of FIG. 1. Here, the coupling section 55 (the common bus bar) is shown to be a uniform metal electrode, which is different from the one in FIG. 1.

Two surface acoustic wave resonators arranged closely in parallel generates an acoustic coupling between the resonators. As a result, two resonance modes φa, φb are excited as shown in FIG. 3. These two resonance modes have different resonance frequencies fa and fb, the difference thereof determining the passband width of the transverse-mode coupling type resonator filter. The frequency difference between fa and fb depends on the degree of confinement of the SAW (Surface Acoustic Wave) energy within each resonator and the coupling degree of the resonators.

The right-hand side of FIG. 3 is a model of the transverse-coupling type multimode filter based on the difference in propagation velocity of the surface acoustic waves in order to determine the frequencies fa and fb. Here, the propagation velocities of the surface acoustic waves propagating through the excitation sections 53, 54, the coupling section 55, and the signal-side bus bars 51, 52 are represented by Vidt, Vgap, and Vbus, respectively. These three velocities must satisfy the following inequality in order that the energy of the surface acoustic waves is confined within the excitation sections 53, 54.

$$\text{Vidt} < \text{Vbus, Vgap} \tag{1}$$

If the two modes of the SAW energy are approximated by scalar potentials φa and φb, the scalar potentials φa and φb are known to satisfy the following equation.

$$\frac{\partial^2 \phi i}{\partial X^2} + \frac{\partial^2 \phi i}{\partial Z^2} + \frac{\omega i}{V^2} = 0 \tag{2}$$

φi: φa or φb
ω: Angular frequency
V: Vidt, Vgap, or Vbus

If the propagation velocities of φa and φb are represented by Va and Vb, respectively, Va and Vb assume values satisfying the following equations.

$$kaW = \text{Tan}^{-1}\left(\frac{\gamma b}{ka}\right) + \text{Tan}^{-1}\left(\frac{\gamma g}{ka}\tanh\left(\gamma g \cdot \frac{G}{2}\right)\right)$$

$$kbW = \text{Tan}^{-1}\left(\frac{\gamma b}{kb}\right) + \text{Tan}^{-1}\left(\frac{\gamma g}{kb}\coth\left(\gamma g \cdot \frac{G}{2}\right)\right)$$

W: Width of excitation section
G: Width of coupling section $$ki = \sqrt{\left(\frac{\omega}{Vi}\right)^2 - \left(\frac{\omega}{Vidt}\right)^2}$$

$$\gamma b = \sqrt{\left(\frac{\omega}{Vbus}\right)^2 - \left(\frac{\omega}{Vi}\right)^2}$$

$$\gamma g = \sqrt{\left(\frac{\omega}{Vgap}\right)^2 - \left(\frac{\omega}{Vi}\right)^2} \quad i = a, b$$

When the velocities Va and Vb are determined, the resonance frequencies fa and fb for the two resonance modes are determined. The difference (fa−fb) determines the passband width. The above argument shows that the passband width of the filters depends on the width of the excitation section, the width of the coupling section, the velocity of the surface acoustic waves propagating through the signal-side bus bar regions, the excitation section, and the coupling section.

Figure 4:
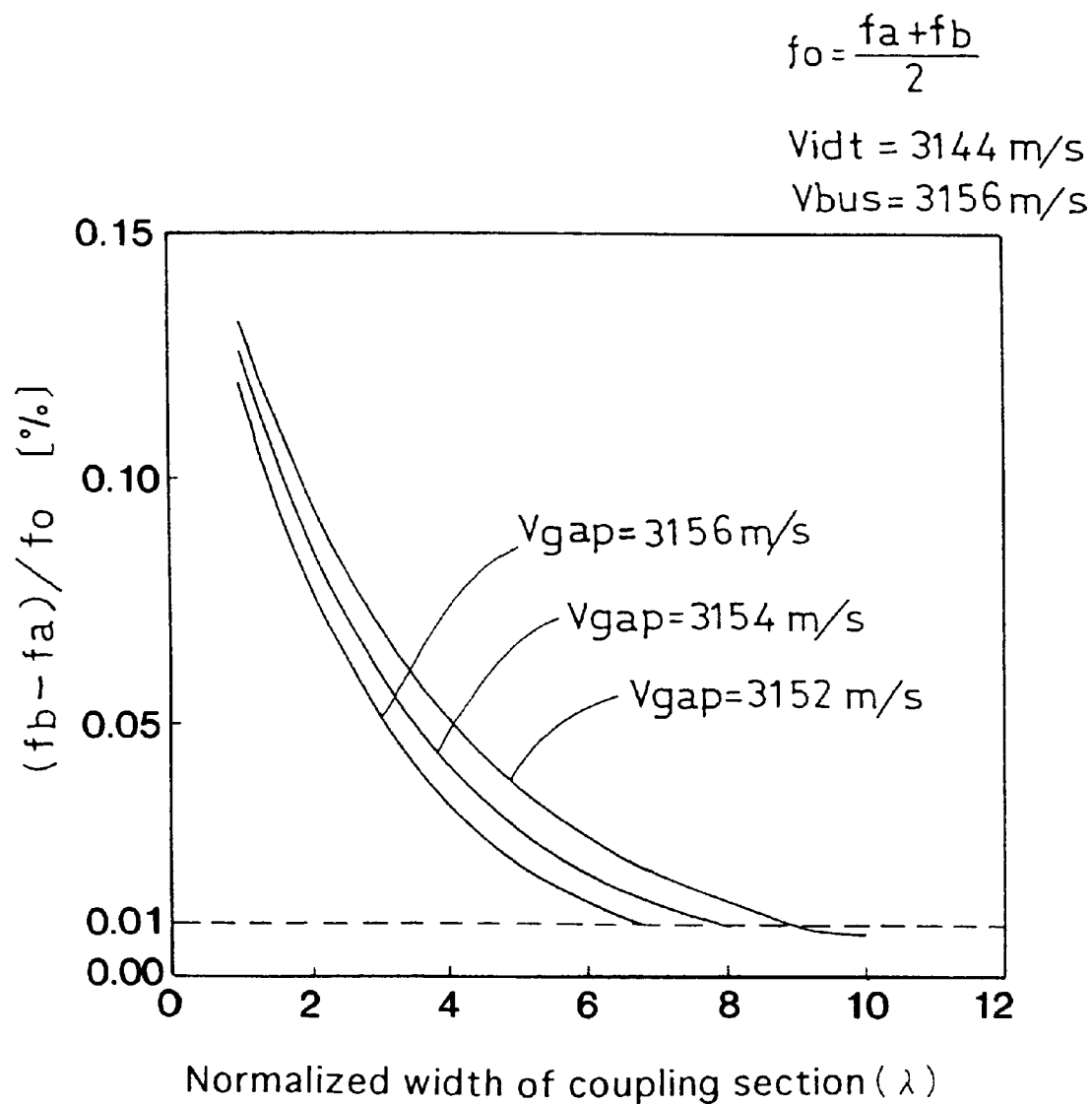
FIG. 4 is a graph showing the pass-band width relative to the width of the coupling section.

FIG. 4 shows the variation in the passband width relative to the width of the coupling section and the propagation velocity vgap of the surface acoustic waves. This shows that, when the width of the coupling section is constant, the passband width can be enlarged by decreasing the velocity Vgap. In order to actually decrease the velocity vgap, it is sufficient that the coupling section has a grating structure as shown in FIG. 1.

Figure 5:
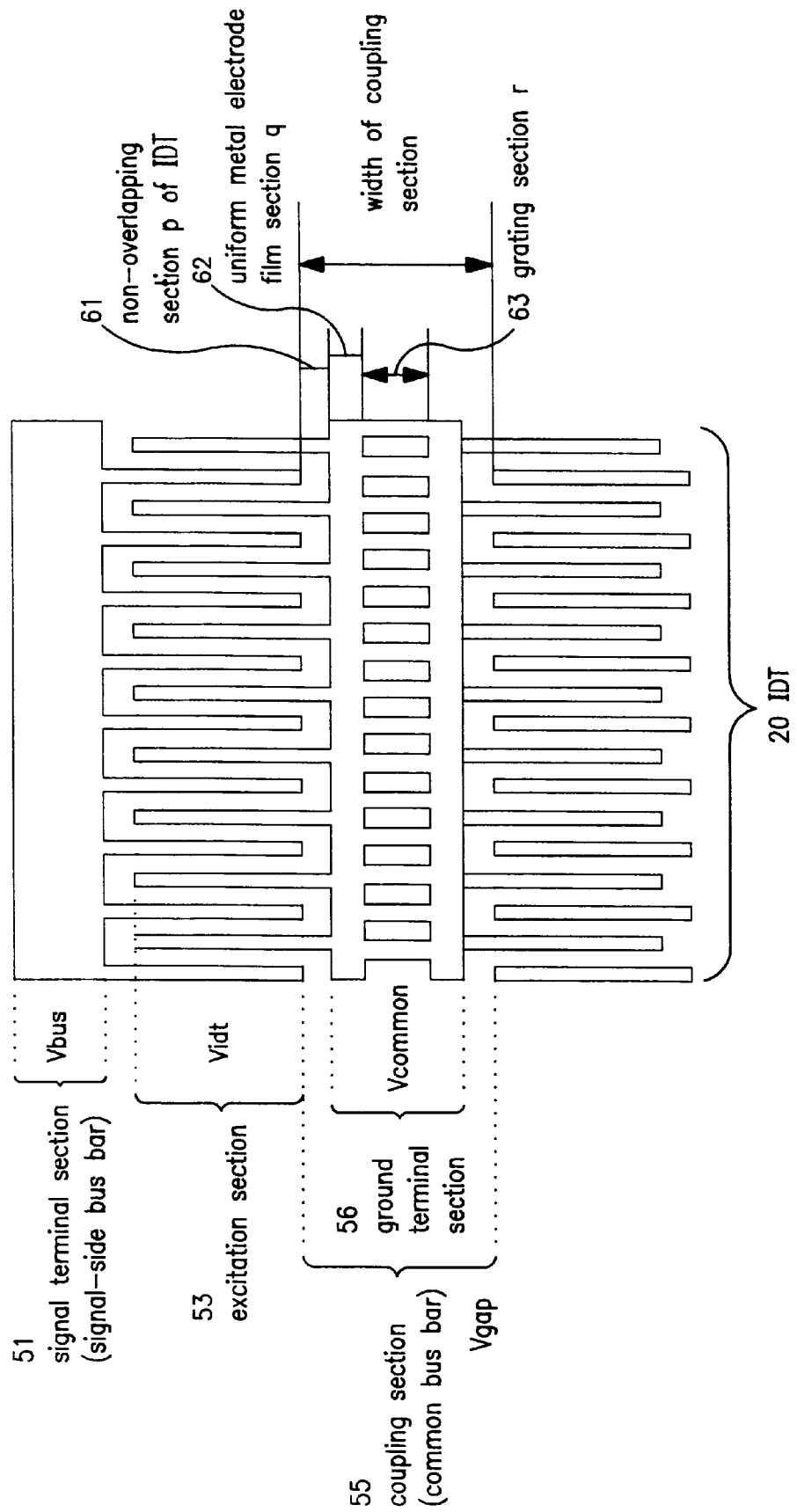
FIG. 5 is a view for showing a construction of a coupling section in the first embodiment according to the present invention.

The structure of the coupling section in FIG. 1 is divided into a non-overlapping section 61 of IDT, a uniform metal electrode film section 62, and a grating section 63, as shown in FIG. 5. Therefore, it is presumed that the velocity of the surface acoustic waves propagating through the coupling section is approximately a mean value of the velocities propagating through the three regions. Here, the velocity of the surface acoustic waves propagating through the grating having slits is lower than the velocity of the surface acoustic waves propagating through the uniform metal electrode film. Therefore, the passband width can be enlarged by allowing a portion of the coupling section to have a grating structure of metal strips in this manner.

Since the area of the metal electrode film becomes large, the propagation velocity of the surface acoustic waves decreases as the line width of the grating increases. Therefore, as the line width of the grating in the coupling section increases, the passband width can be enlarged. Here, if the line width of the grating is larger than the line width of the excitation section 53 of IDT, the velocity propagating through the grating section 63 of IDT is smaller than the velocity through the excitation section 53 of IDT, whereby confinement of the modes might disappear. However, as described above, the velocity of the surface acoustic waves propagating through the coupling section 55 of IDT is a mean value of the velocities for the three regions, so that the confinement of modes occurs.

As an embodiment for Example 1, a transverse-coupling type multimode filter was prepared having a center frequency of 245 MHz such as the following.

Figure 10A:
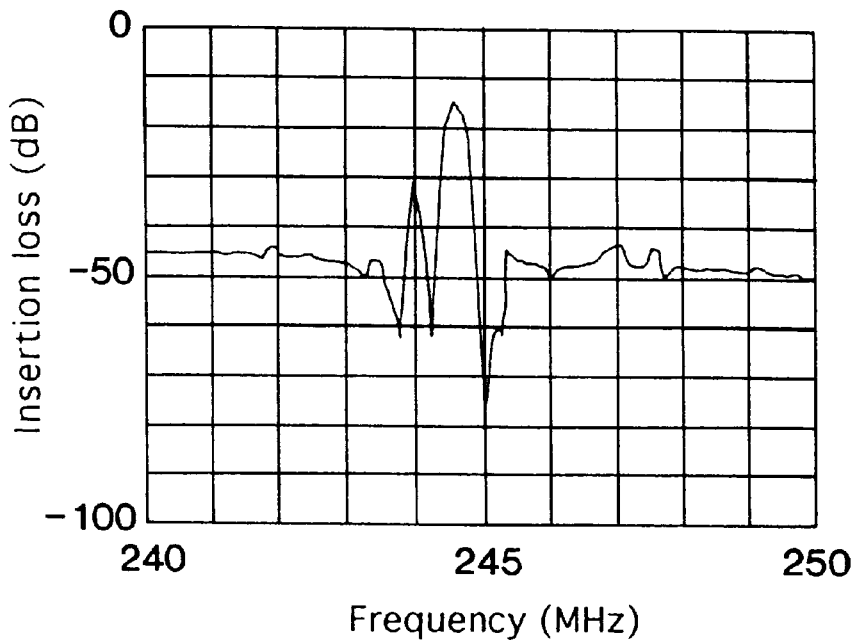
FIG. 10 is a graph showing bandpass characteristics of a filter of the first embodiment according to the present invention.
Figure 10B:
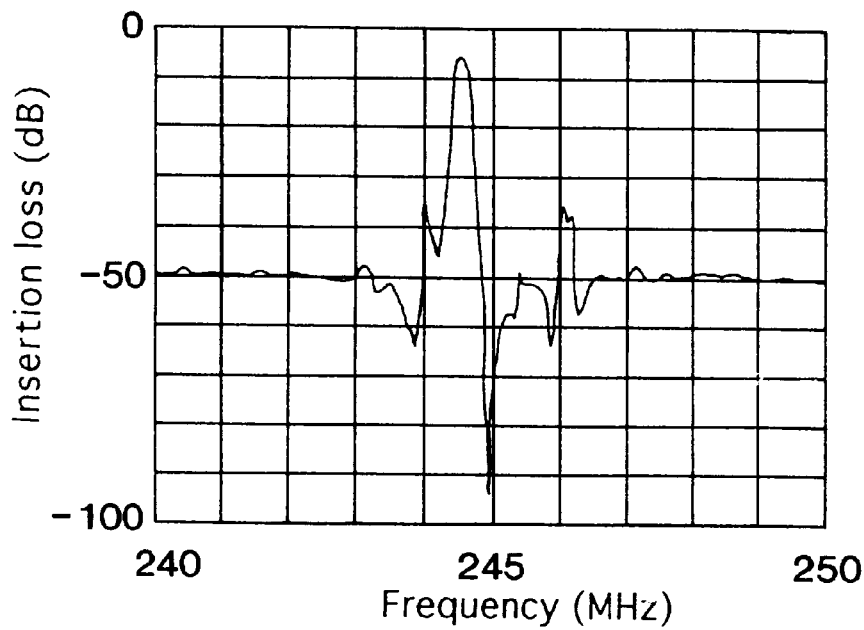

Piezoelectric substrate: ST-cut quartz
Electrode period λ of IDT: 12.8 μm
Line width (d) of interdigital electrodes of IDT: 3.2 μm
Interval (c) of interdigital electrodes of IDT: 3.2 μm
Film thickness of interdigital electrodes of IDT: 0.15 μm
Number of electrode pairs of IDT: 200 pairs
Number of electrode pairs of reflector: 200 pairs
Width (W) of excitation section of IDT: 7 λ
Width (G) of coupling section: 1.8 λ
Metal electrode width (a) of common bus bar: 4.8 μm
Slit width (b) of common bus bar: 1.6 μm
Material for IDT and metal electrode: Al FIG. 10(a) shows bandpass characteristics of the filter of Example 1 according to the present invention. FIG. 10(b) shows bandpass characteristics when the common bus bar is formed entirely of a uniform metal electrode film.

Here, the propagation velocity of the surface acoustic waves propagating through the excitation section of IDT is Vidt=3143 m/s. The propagation velocity at the common bus bar with the grating structure in FIG. 10(a) is 3148 m/s. The propagation velocity at the common bus bar made of uniform metal electrode film in FIG. 10(b) is 3156 m/s.

The passband width is 300 KHz in FIG. 10(a), whereas the passband width is 230 KHz in FIG. 10(b).

Accordingly, it is understood that a passband width which is approximately 1.3 times larger can be obtained by allowing the coupling section (the common bus bar) to have a grating structure.

Also, the relative band width (300 KHz/245 MHz) is approximately 0.12%, which satisfies the design requirement for digital cordless telephones such as a PHS.

FIG. 4 shows that, when the width G of the coupling section is more than 10 λ (wherein λ is a period in IDT), the relative passband width will be less than 0.01%, which is not an acceptable value for practical use, even if the velocity vgap of the coupling section is decreased. Therefore, the width G of the coupling section is preferably less than 10 λ.

Next, the difference in velocities of the surface acoustic waves propagating through the coupling section, the excitation section and the signal terminal section will be described.

Reference is made to an IDT 20 including a coupling section such as shown in FIG. 5. Namely, the coupling section 55 of the IDT 20 is formed of a "non-overlapping section 61 of the IDT", a "uniform metal electrode film section 62", and a "grating section 63". Here, an ST-cut quartz is used as a material for the piezoelectric substrate, and Al having a thickness of about 0.36 μm is used as an electrode material for each section of the IDT 20.

Also, it is so set that the width p of the "non-overlapping section 61 of the IDT 20" shown in FIG. 5 is p=2.445 μm, the width q of the "uniform metal electrode film section 62" is q=1.252 μm, the width r of the "grating section 63" is r=3.635 μm, the line width of the excitation section 53 of the IDT 20 is 50% of the half period of the electrodes, and the line width of the grating section 63 is 60% of the half period of the electrodes.

In this case, the velocity (Vmetal) of the surface acoustic waves propagating under the uniform metal electrode film is about 3149 m/s, and the velocity (Vidt) of the surface acoustic waves propagating through the excitation section 53 is about 3092 m/s. Also, since the signal terminal section 51 in FIG. 5 is formed of a uniform metal electrode film, the velocity (Vbus) of the surface acoustic waves propagating through the signal terminal section 51 is equal to Vmetal which is about 3149 m/s.

On the other hand, since the coupling section 55 is formed of three sections 61, 62, and 63 as shown above, the velocity of the surface acoustic waves propagating through the coupling section 55 cannot be experimentally measured. However, the velocity of the surface acoustic waves propagating through the coupling section 55 can be deduced by the following calculation.

The velocity of the surface acoustic waves propagating through each section of the coupling section is as follows:
3104 m/s at the "non-overlapping section 61 of the IDT,
3149 m/s at the "uniform metal electrode film section 62,
3087 m/s at the "grating section".

From the propagating velocity at each section and the above-mentioned width of each section, the velocity (Vgap) at the coupling section as a whole can be calculated in the following manner.

$$V_{gap}=(3104\times2.445\times2+3149\times1.252\times2+3087\times3.635)/(2.445\times2+1.252\times2+3.635)=3109 \text{ m/s}$$

Accordingly, the above propagation velocities satisfy the following relation:

$$V_{metal}=V_{bus}>V_{gap}>V_{idt}.$$

The portion of the coupling section 55 of FIG. 5 excluding the non-overlapping section 61 of the IDT 20 is called a "ground terminal section 56". In other words, the ground terminal section 56 is formed of the "uniform metal electrode film section 62" and the "grating section 63".

Vcommon, the velocity of the surface acoustic waves propagating through the ground terminal section 56, can be calculated as follows:

$$V_{common}=(3149\times1.252\times2+3087\times3.635)/(1.252\times2+3.635)=3112 \text{ m/s}.$$

Accordingly, the propagating velocity Vbus (=3149 m/s) at the signal terminal section 51 and the propagating velocity Vcommon at the ground terminal section 56 satisfy the following relation:

$$V_{bus}>V_{common}.$$

Figure 19:
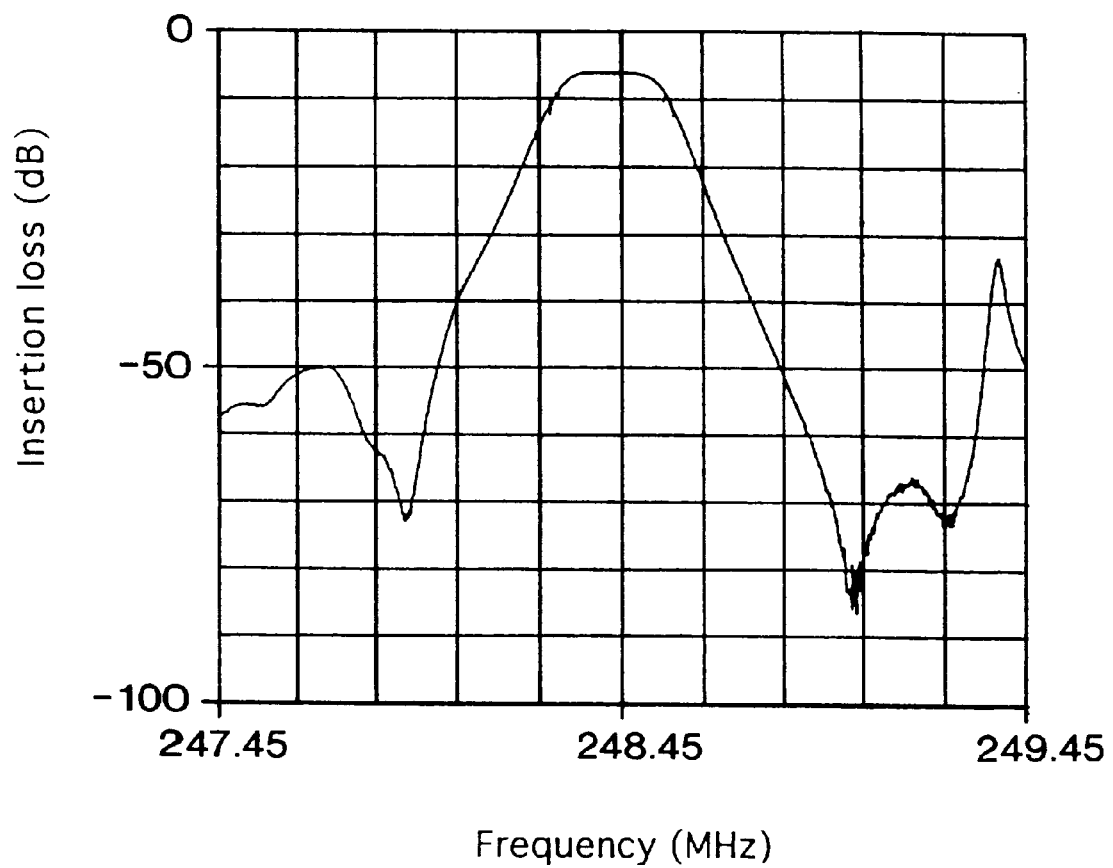
FIG. 19 is a graph showing bandpass characteristics of a filter of the first embodiment according to the present invention.

In this case, the filter characteristics with wider passband similar to those in FIG. 10(a) were observed as shown in FIG. 19, which showed an increase of about 19% in the bandwidth as compared with the conventional cases.

Here, in the conventional construction where the coupling section is formed of a uniform metal electrode film, the following relation is satisfied:

$$V_{metal}=V_{bus}=V_{gap}>V_{idt}.$$

Next, an explanation will be given to cases in which the signal terminal section 51 includes a grating structure in addition to the above construction.

For example, if the signal terminal section 51 includes a grating structure with the line width of the metal electrode being 30%, the velocity Vbus was equal to 3101 m/s, thus satisfying the following relation:

$$V_{metal}>V_{gap}>V_{bus}>V_{idt}.$$

In this case, the spurious response level was significantly suppressed at the high frequency side of the passband.

Next, an explanation will be given to a case in which the width of the grating section 63 of the coupling section shown in FIG. 5 is 5 μm and the signal terminal section 51 includes a grating structure with the line width of the metal electrode being 20%.

Here, both of the velocities Vbus and Vgap were about 3106 m/s, thus satisfying the following relation:

$$V_{metal}>V_{bus}=V_{gap}>V_{idt}.$$

In this case, the passband width was enlarged by 23% and, at the same time, the spurious response level was significantly suppressed.

Next, an explanation will be given to a case in which the width of the grating section 63 of the coupling section shown in FIG. 5 is 7 μm and the signal terminal section 51 includes a grating structure with the line width of the metal electrode being 20%.

Here, the velocity Vgap was about 3104 m/s, thus satisfying the following relation:

$$V_{metal}>V_{bus}>V_{gap}>V_{idt}.$$

In this case, the passband width was enlarged by 11% and, at the same time, the spurious response level was suppressed as in the above case.

Example 2

Figure 2:
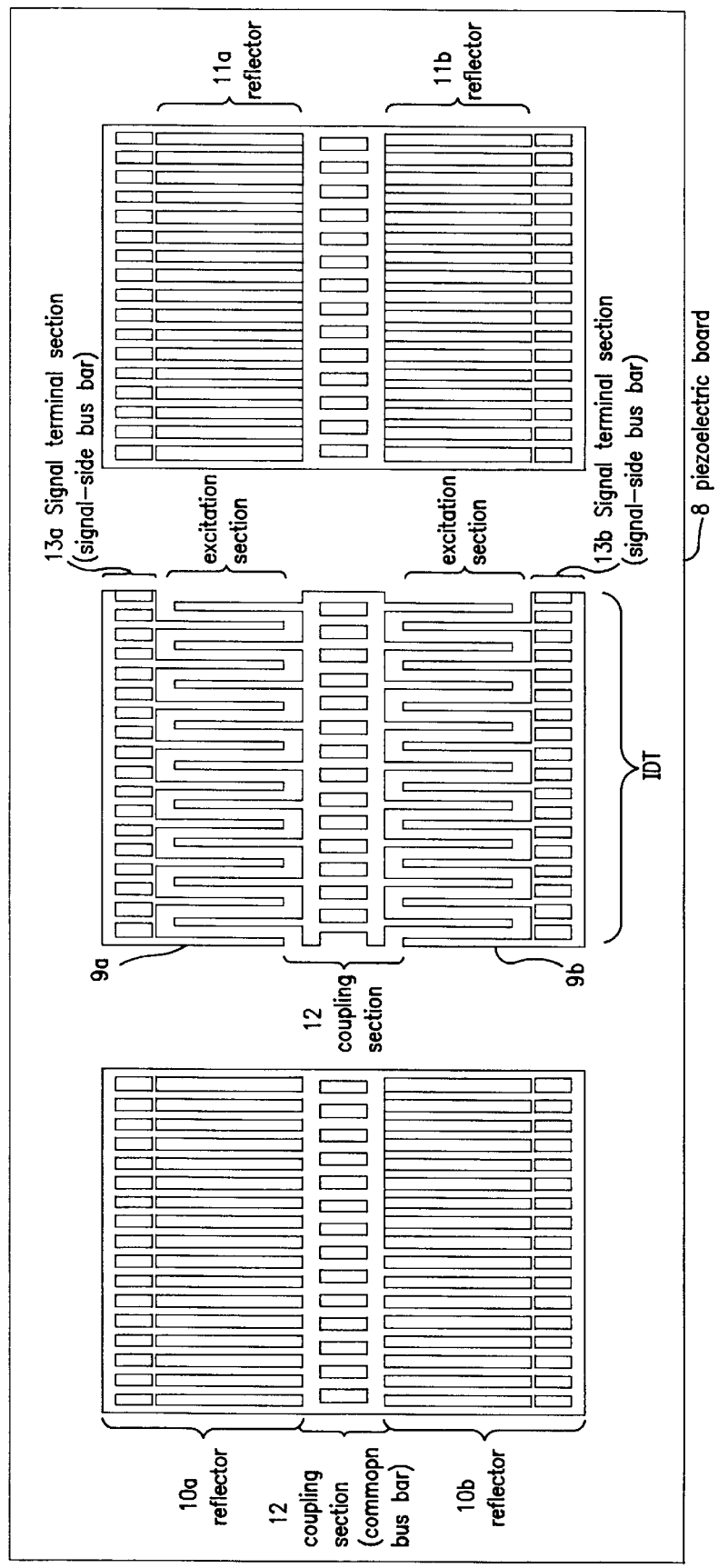
FIG. 2 is a view for showing a construction of a second embodiment of multimode surface acoustic wave filter according to the present invention.

FIG. 2 shows a second example of a multimode surface acoustic wave filter according to the present invention. As in FIG. 1, the filter includes IDTs (9a, 9b) and reflectors (10a, 11a, 10b, 11b), each of the IDTs consisting of an excitation section and a signal terminal section. The two surface acoustic wave resonators are acoustically coupled with a coupling section 12.

This example is characterized in that a portion of the signal terminal sections (the signal-side bus bars) 13a, 13b of IDT and a portion of the terminal sections 32 of the reflectors are formed to have a grating structure of metal strips.

Generally, the presence of spurious response outside the passband has a bad influence on the damping characteristics outside the passband. Therefore, it is desired to repress the spurious response as much as possible. A structure as shown in FIG. 2 can make an improvement in repressing spurious response on the high frequency side. As a result of this, a filter can be obtained having a relative band width of about 0.1% and with repressed spurious response.

Figure 6:
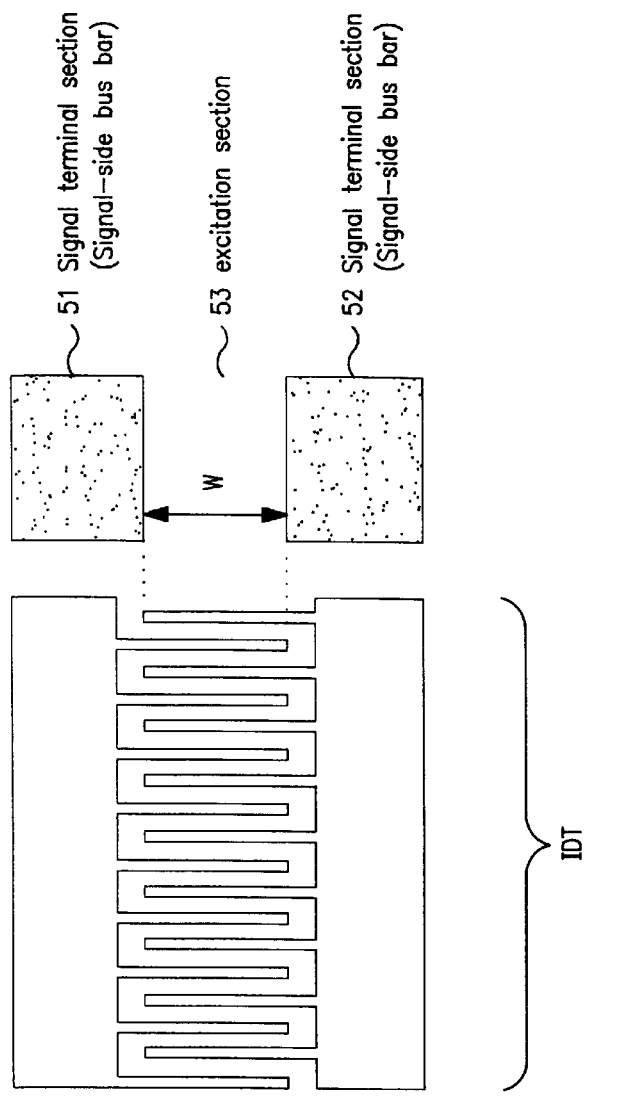
FIG. 6 is a view for showing a general construction of an interdigital transducer.
Figure 6:
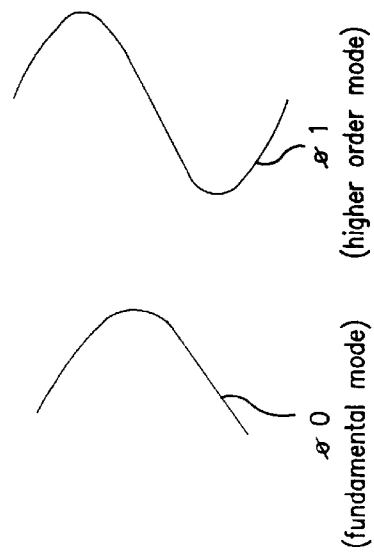

The propagation velocity of the surface acoustic waves and the width of the excitation section of IDT will hereinafter be explained. These are factors in affecting the spurious response on the high frequency side. FIG. 6 shows a general example of one surface acoustic wave resonator constituting a transverse-coupling type multimode filter.

When a model for the signal-side bus bar regions 51, 52 and the excitation section region 53 is prepared as shown on the right-hand side of FIG. 6, the SAW energy is confined within the excitation section.

Here, the number of the confined modes is determined by the width W of the excitation section. For example, there will be two modes $\phi_0$ (fundamental mode) and $\phi_1$ (higher mode) such as shown on the left-hand side of FIG. 6. It is known that, as the width W of the excitation section increases, the number of generated modes increases.

Figure 7:
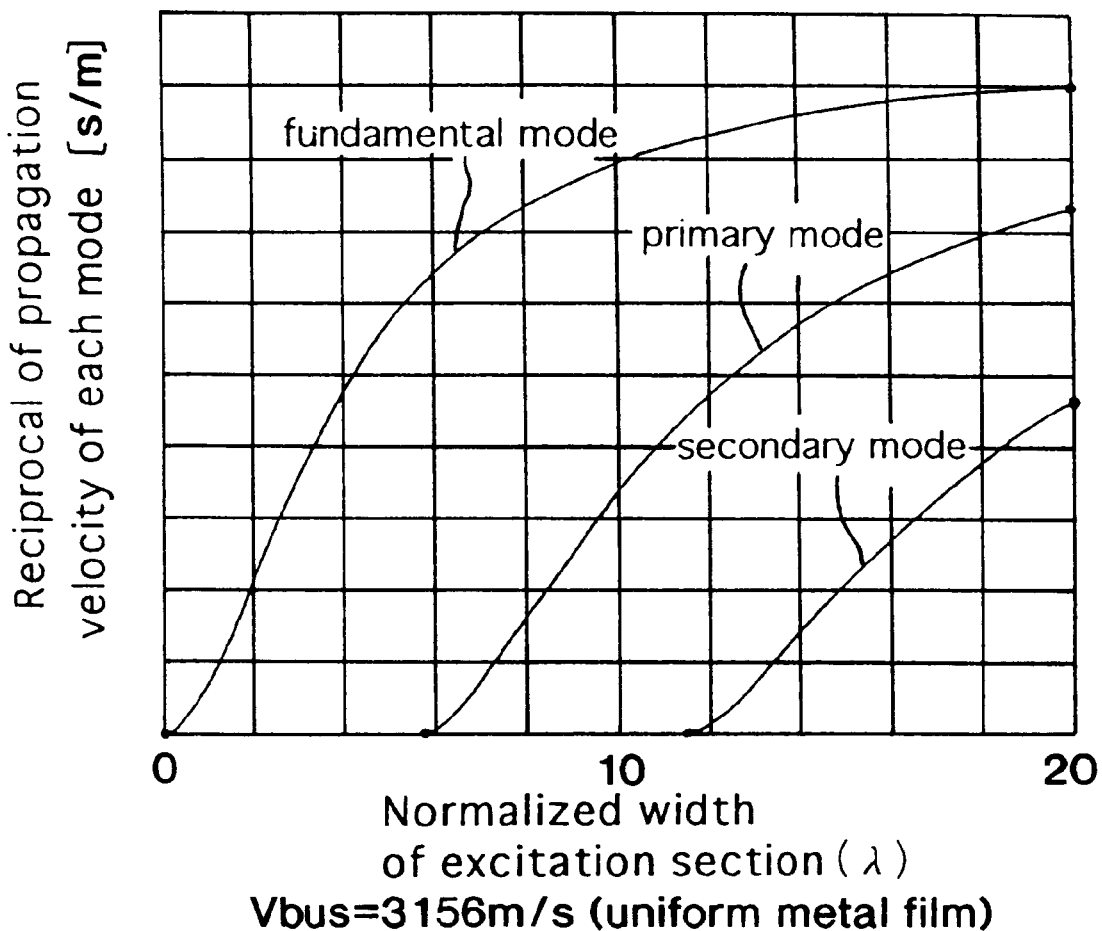
FIG. 7 is a graph showing surface acoustic wave modes relative to the width of the excitation section.
Figure 8:
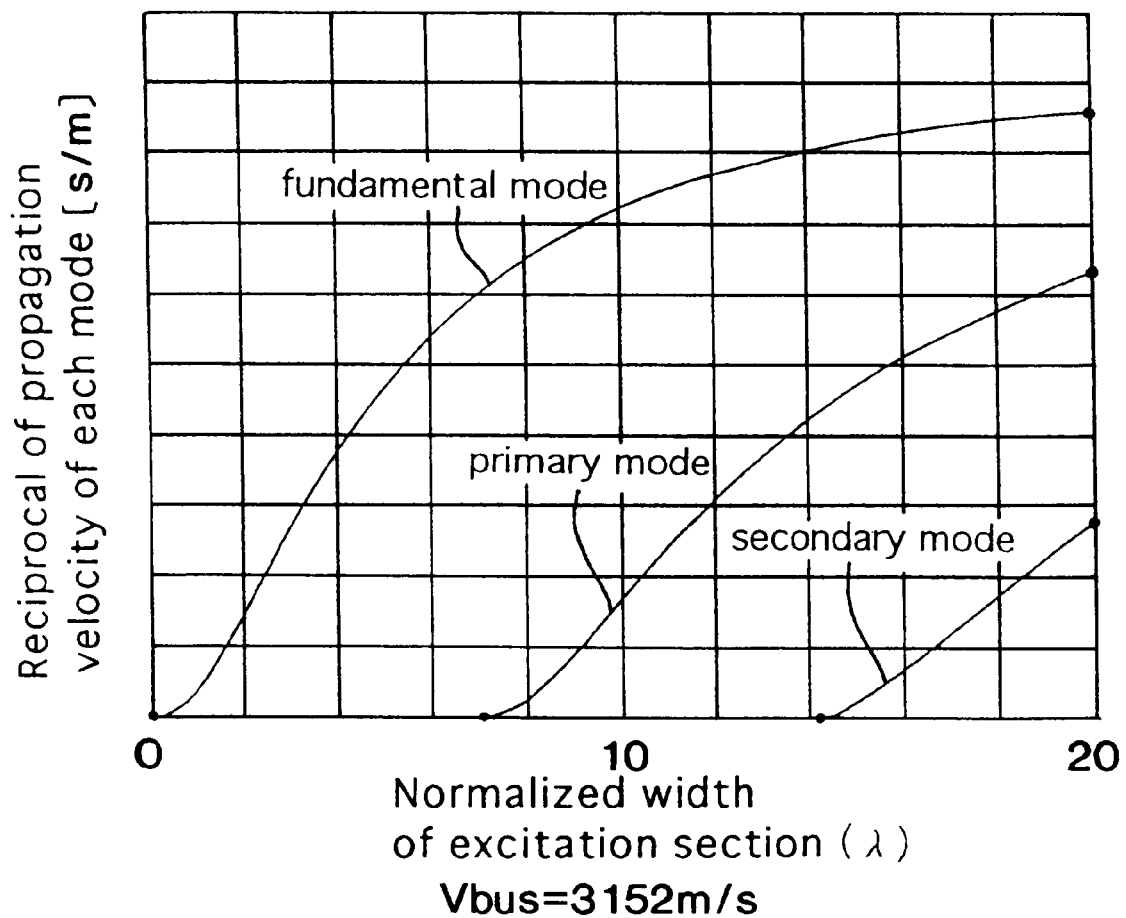
FIG. 8 is a graph showing surface acoustic wave modes relative to the width of the excitation section.
Figure 9:
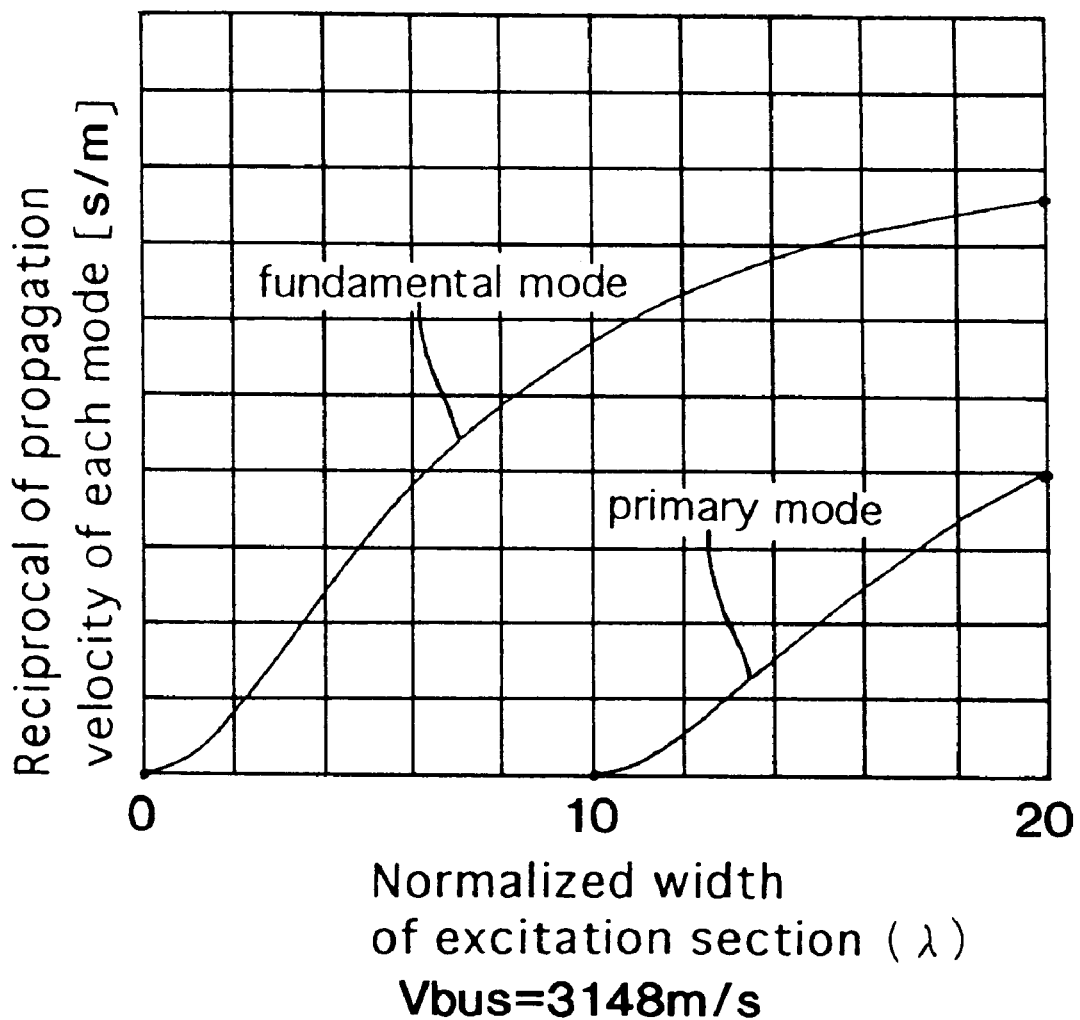
FIG. 9 is a graph showing surface acoustic wave modes relative to the width of the excitation section.

FIGS. 7–9 show relationships between the width W of the excitation section and the modes of surface acoustic waves. Referring to each of the Figures, the lateral axis (axis of abscissas) represents the width of the excitation section normalized by the electrode period $\lambda$ of IDT, and the vertical axis (axis of ordinates) represents the reciprocal of the propagation velocity of the surface acoustic waves of each mode. In FIGS. 7, 8, and 9, the propagation velocity Vbus of the surface acoustic waves propagating through the signal-side bus bars is 3156 m/s, 3152 m/s, and 3148 m/s, respectively.

The figures show that, as the width of the excitation section increases, surface acoustic waves of higher order modes appear. Acting as spurious response on the high frequency side, these higher order modes have a bad influence on the filter.

Comparison of FIGS. 7–9 shows that, as the propagation velocity Vbus decreases, the width of the excitation section giving higher modes increases. In other words, as the propagation velocity Vbus of the surface acoustic waves propagating through the terminal-side bus bar regions decreases, the higher modes are less likely to appear even if the normalized width of the excitation section is large, thereby leading to large flexibility in designing the width of the excitation section.

On the other hand, if the width of the excitation section is small, the electric isolation between the inputs and outputs will be bad, causing inferior rejection level outside the passband of the filter.

Therefore, by reducing the propagation velocity vbus of the surface acoustic waves propagating through the terminal-side bus bar regions, it is possible to repress the high frequency spurious response even if the width of the excitation section is increased.

However, in order to confine the SAW energy within the excitation section, the propagation velocity Vbus must be larger than the propagation velocity Vidt of the surface acoustic waves propagating through the excitation section, as mentioned before.

Therefore, by allowing the signal-side bus bar 13a, 13b to have a grating structure as shown in FIG. 2, the velocity Vbus of the surface acoustic waves propagating through the signal-side bus bar regions is decreased, compared with the case where the signal-side bus bar is formed of uniform metal film as shown in FIG. 1. Further, the velocity Vbus is set to be a little larger than the velocity Vidt of the surface acoustic waves propagating through the excitation section 53, 54.

This reduces the difference between the velocity of the surface acoustic waves propagating through the signal-side bus bars and the velocity of the surface acoustic waves propagating through the excitation section of IDT, thereby weakening the confinement of the resonance modes.

The weakening of the confinement of the transverse modes restrains generation of unnecessary transverse-mode surface acoustic waves of higher order, thereby repressing the spurious response on the high frequency side outside the passband.

Here, as an embodiment for the second example, a transverse-coupling type multimode filter was prepared having a center frequency of 245 MHz such as the following.

Figure 11A:
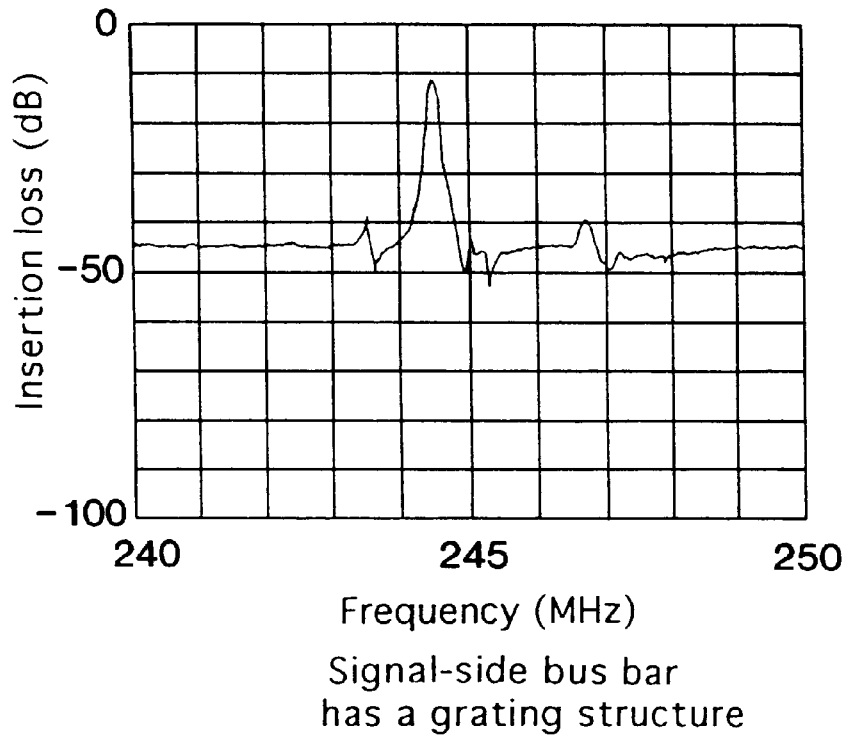
FIG. 11 is a graph showing bandpass characteristics of a filter of the second embodiment according to the present invention.
Figure 11B:
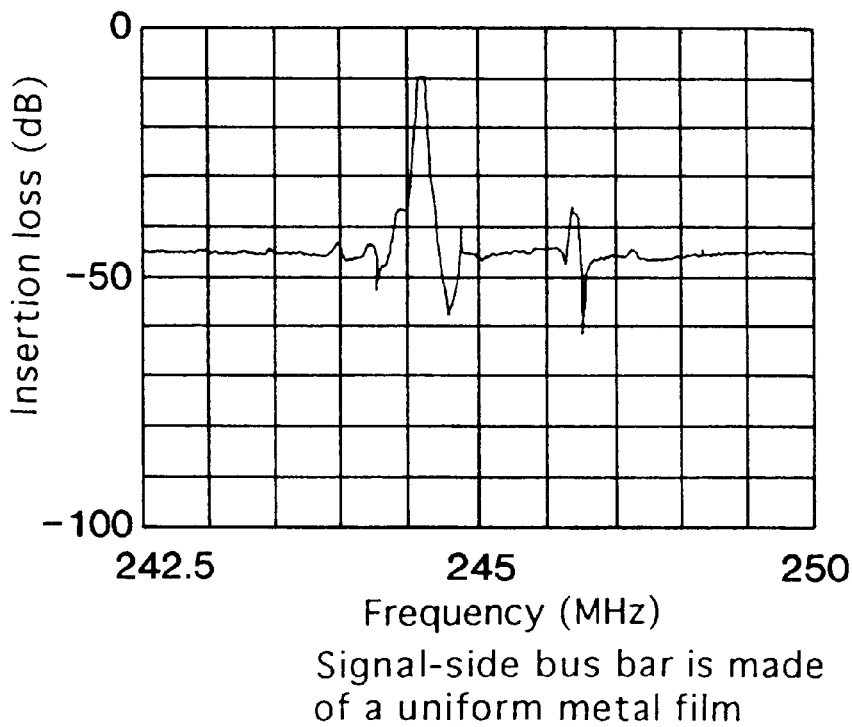

Piezoelectric substrate: ST-cut quartz
Electrode period of IDT: 12.8 $\mu$m
Line width (d) of interdigital electrodes of IDT: 3.2 $\mu$m
Interval (c) of interdigital electrodes of IDT: 3.2 $\mu$m
Film thickness of interdigital electrodes of IDT: 0.15 $\mu$m
Number of electrode pairs of IDT: 200 pairs
Number of electrode pairs of reflector: 200 pairs
Width (W) of excitation section of IDT: 10 $\lambda$
Width (G) of coupling section: 1.8 $\lambda$
Metal electrode width (a) of common bus bar: 4.8 $\mu$m
Slit width (b) of common bus bar: 1.6 $\mu$m
Metal electrode width (g) of signal-side bus bar: 2.8 $\mu$m
Slit width (h) of signal-side bus bar: 3.6 $\mu$m
Material for IDT and metal electrode: Al FIG. 11(a) shows bandpass characteristics of the filter of Example 2 according to the present invention. FIG. 11(b) shows bandpass characteristics when the signal-side bus bar is formed entirely of a uniform metal electrode film.

Here, the propagation velocity of the surface acoustic waves propagating through the excitation section of IDT is Vidt=3143 m/s. The propagation velocity at the signal-side bus bar with the grating structure in FIG. 11(a) is 3148 m/s. The propagation velocity at the signal-side bus bar made of the uniform metal electrode film in FIG. 11(b) is 3156 m/s.

Comparison of FIG. 11(a) and FIG. 11(b) shows that the generation of spurious response at the high frequency side of the passband decreases by adopting the grating structure of the present invention as shown in FIG. 2.

The width of the excitation section of the conventionally used IDTs was about 7 $\lambda$. However, even if the width of the excitation section is enlarged to 10 $\lambda$ as in this embodiment, spurious response level is not adversely affected.

In this embodiment, the metal electrode width g (2.8 $\mu$m) of the signal-side bus bar is smaller than the line width d (3.2 $\mu$m) of IDT.

This is due to the fact that almost all of the signal-side bus bar regions have a grating structure as shown in FIG. 2. In other words, since the propagation velocity of the surface acoustic waves at the signal-side bus bar regions is almost equal to the propagation velocity of the surface acoustic waves propagating immediately under the grating structure, there will be no confinement of the modes if the line width of IDT is equal to the line width of the grating of the signal-side bus bar regions.

Therefore, it is necessary that the propagation velocity of the surface acoustic waves at the signal-side bus bar regions is larger than the propagation velocity at the excitation section of IDT, so that the metal electrode width of the signal-side bus bar is made smaller than the line width of the IDT, as described above.

Similar effects can be obtained by allowing the ratio (g/h) of the metal electrode width (g) to the slit width (h) of the signal-side bus bar to be smaller than the ratio (d/c) of the line width (d) to the interval (c) of IDT.

In this embodiment, g/h=2.8/3.6=0.78, and d/c=3.2/3.2= 1.0.

When a quartz substrate is used, the width (W) of the excitation section is preferably less than 20 λ.

Referring to FIG. 7 and others, it is understood that unnecessary spurious response due to higher modes is generated if the width of the excitation section is increased.

Here, if the spurious response is caused by a single higher order mode, the frequency position at which the spurious response is generated can be controlled by finely adjusting the width of the excitation section, so that problems are unlikely to occur.

Therefore, width of the excitation section must be designed within the range that does not cause generation of secondary mode spurious response. Also, in view of the flexibility in design and the electric isolation of inputs and outputs, it is preferable that the range of width of the excitation section is wider. Accordingly, it is understood that, preferably, the propagation velocity at the common bus bar is low and the width (W) of the excitation section is less than 20 λ, as shown in FIG. 9.

Example 3

The first example illustrated in FIG. 1 shows that, by introducing a grating structure of metal strips into the coupling section (the common bus bar) 5, the velocity of the surface acoustic waves at the coupling section can be reduced.

The second example illustrated in FIG. 2 shows that, by introducing a similar grating structure also into the signal-side bus bar 13a, 13b, the velocity of the surface acoustic waves at the signal-side bus bar can also be reduced.

It has been shown that the relative band width can be improved in the first example and the generation of the spurious response can also be repressed in the second example.

In addition to this, the propagation velocity of the surface acoustic waves at the coupling section or the signal-side bus bar can be reduced by providing a mass loading to the metal electrode at the coupling section or the signal-side bus bar.

Figure 12:
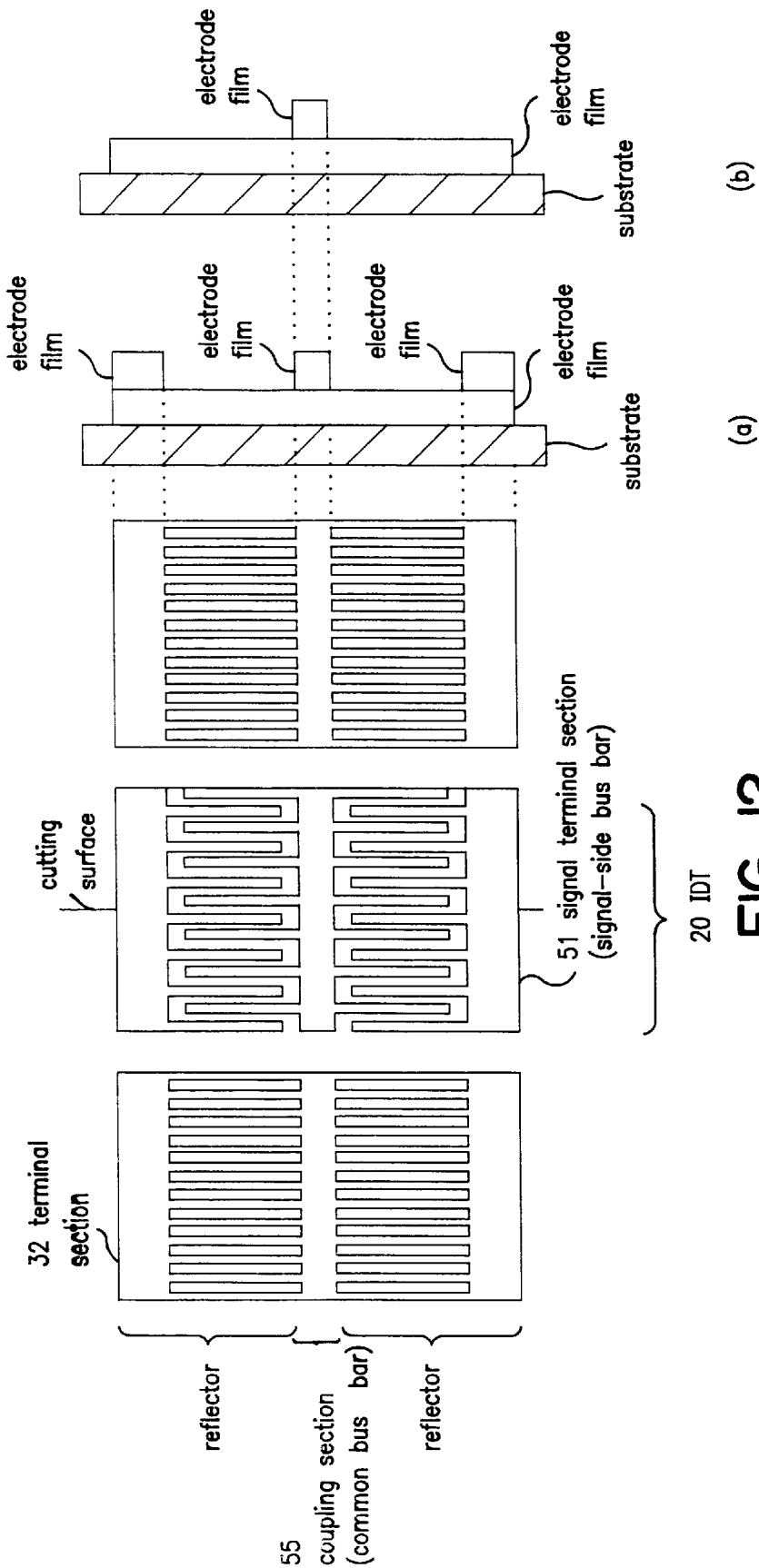
FIG. 12 is a view for showing a construction of a third embodiment of multimode surface acoustic wave filter according to the present invention.

FIG. 12(a) shows an example in which the film thickness of the metal electrode at the coupling section 55 and at the signal-side bus bar is larger than the film thickness at other portions such as the excitation region. FIG. 12(b) shows an example in which the film thickness of the metal electrodes at the coupling section 55 is enlarged.

For example, in FIG. 12(a), the film thickness of IDT is 0.2 μm, and the film thickness of the coupling section 55 and the signal-side bus bar is 0.4 μm. In FIG. 12(b), the film thickness of IDT and the signal-side bus bar is 0.2 μm, and the film thickness of the coupling section 55 is 0.4 μm.

This can lower the propagation velocity of the surface acoustic waves at the coupling section and/or the signal-side bus bar by about 8 m/s.

FIG. 13(a) shows an example in which a dielectric film is superposed on the metal electrode film of the signal-side bus bar and the coupling section 55. FIG. 13(b) shows an example in which a dielectric film is superposed on the metal electrode film of the coupling section 55. The dielectric film to be used may be made of, for example, $SiO_2$ or SiN and the thickness thereof may be about 0.1 μm.

In this way, superposition of a dielectric film on the metal electrode film can decrease the propagation velocity of the surface acoustic waves at the coupling section 55 or the signal-side bus bar by its mass loading effect.

Further, the superposition structure of the dielectric film may be as shown in FIG. 14(a) or FIG. 14(b). Namely, a dielectric film may be superposed with a thickness of about 0.1 μm on the entire metal electrode film of the IDT 20 and the reflectors, and an additional dielectric film may be further superposed with a thickness of about 0.1 μm on the metal electrode film portion of the coupling section 55 and of the signal-side bus bar or, alternatively, only on the metal electrode film portion of the coupling section 55.

This reduces the possibility of metal film corrosion because the entire metal film is covered with a dielectric film when compared with a method of superposing a dielectric film shown in FIG. 13.

Also, as in the above Example, the metal material of the coupling section and/or the terminal-side bus bar may be different from the metal material of IDT in order to reduce the propagation velocity of the surface acoustic waves by mass loading effect.

For example, if Al is used as the metal material for IDT, the metal material for the coupling section 55 or the signal-side bus bar may be Cu, Au, Al—Cu alloy, or the like which has a larger specific weight than Al.

As another embodiment, the coupling section may have a grating structure of metal strips as shown in Example 1 and may have a further structure where mass loading is provided on the metal electrodes as shown in Example 3. Alternatively, the mass loading structure of Example 3 may be further provided in the construction of Example 2.

Example 4

Figure 15:
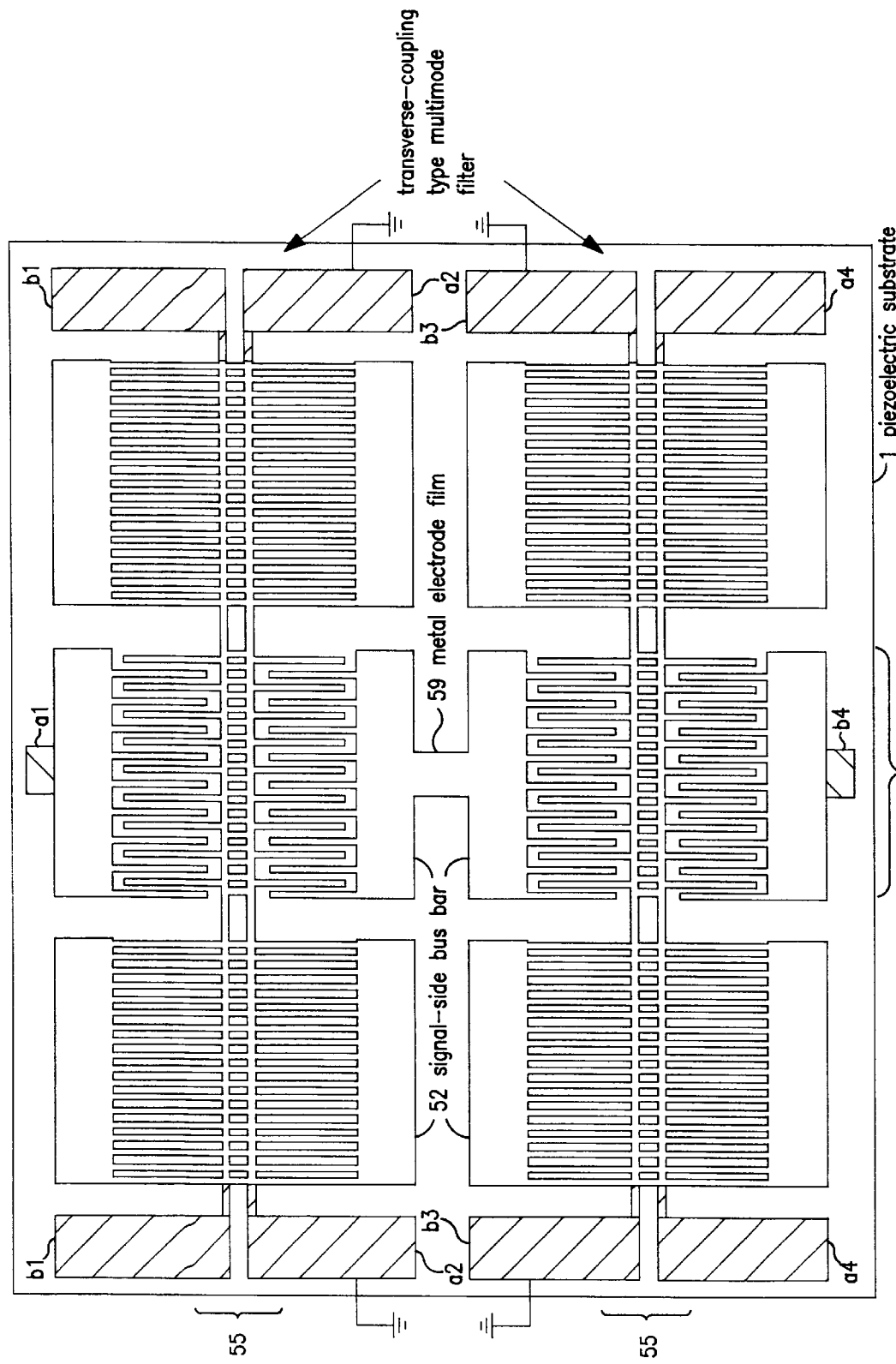
FIG. 15 is a view for showing a construction of a fourth embodiment of multimode surface acoustic wave filter according to the present invention.

FIG. 15 shows an example in which the transverse-coupling type multimode filters described in the Example 1 of the present invention are connected in cascade.

Referring to FIG. 15, a uniform metal electrode film 59 is provided in the vicinity of the central portion of the IDT 20 for connecting the signal-side bus bars 52 of the IDTs with each other. Each coupling section 55 extends in a direction parallel to the propagation direction of the surface acoustic waves and is formed to include input terminal electrodes (a1, a2, b1) and output terminal electrodes (a4, b3, b4) disposed outside the reflectors for electrical connection with outer circuits. Here, as shown in the figure, input and output terminal electrodes a2, b3 on one side are separately grounded. The connecting metal electrode film 59 has a width of about 200 μm and a length of about 500 μm.

Figure 16:
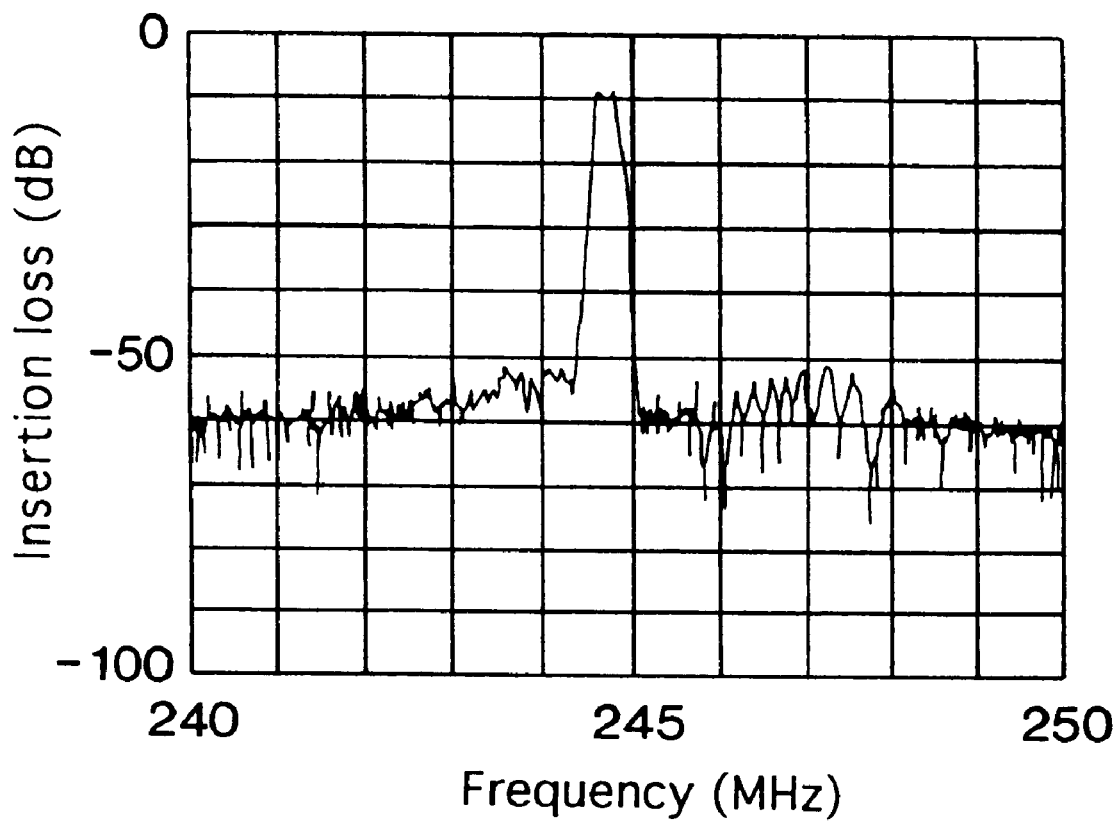
FIG. 16 is a graph showing bandpass characteristics of a filter of the fourth embodiment according to the present invention.
Figure 20:
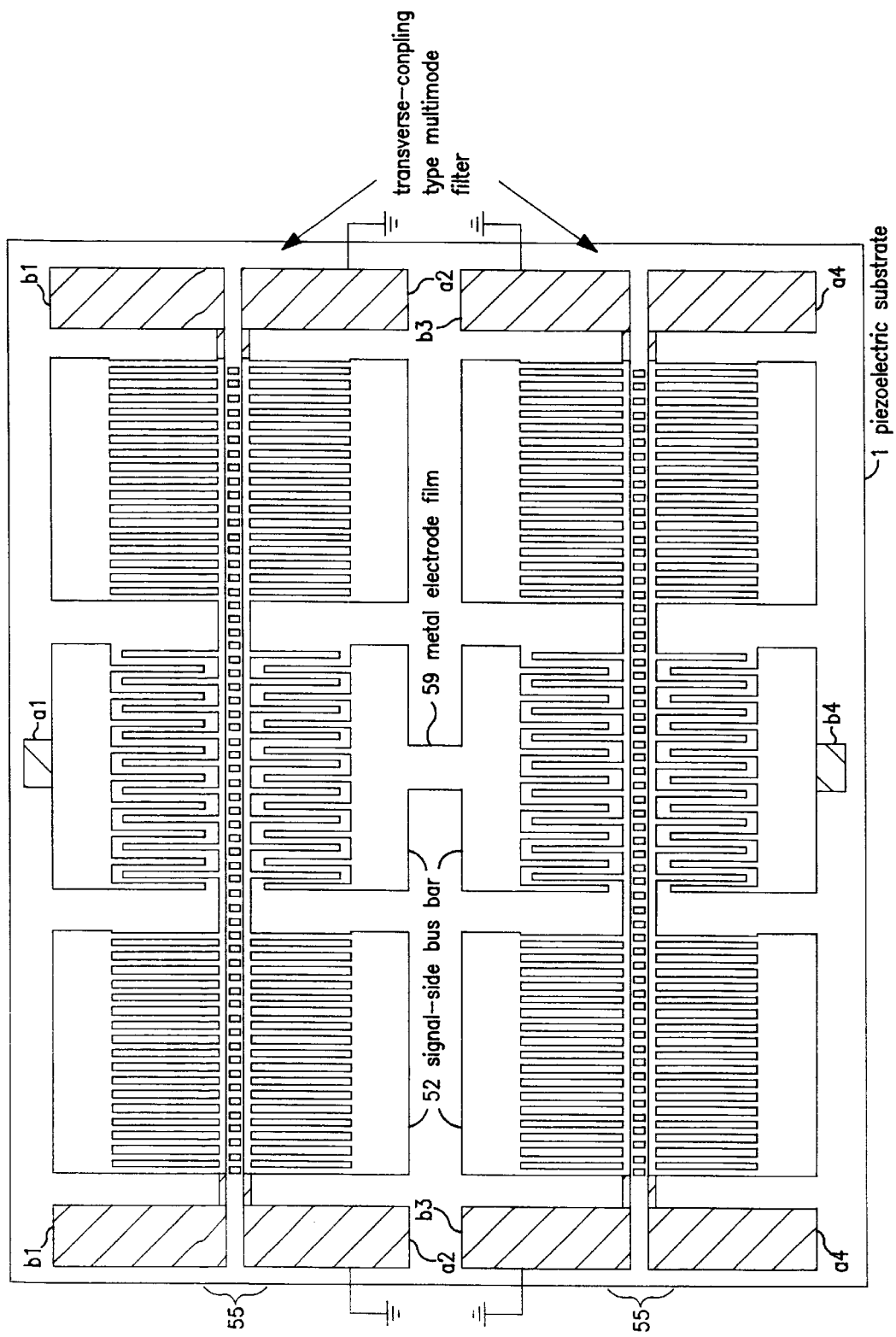
FIG. 20 is a view for showing a construction of a modified example of the fourth embodiment of the present invention.

FIG. 16 illustrates the passband characteristics of the Example 4. FIG. 16 shows that cascade connection improves the repression of spurious response outside the passband and provides good filter characteristics suitable for practical use. Although cascade connection in two rows has been shown in the Example, connection in three or more rows may be suitable as well. Also, the coupling section 55 may be formed into a pattern having floating electrodes electrically separated from the excitation section of the IDT, as shown in FIG. 20.

Example 5

This Example shows an embodiment in which an AT-cut quartz is used for the piezoelectric substrate.

A transverse-coupling type multimode filter having a center frequency of 248 MHz was prepared on an AT-cut (36°-rotated Y-cut) quartz substrate with the electrode period of IDT being 12.6 μm, the electrode film thickness being 0.3 μm, the number of electrode pairs of IDT being 200, the number of electrode pairs of the reflector being 150, the width of the excitation section being 7 λ, and the width of the coupling section being 1.8 λ. The common bus bar has a grating structure.

Figure 17A:
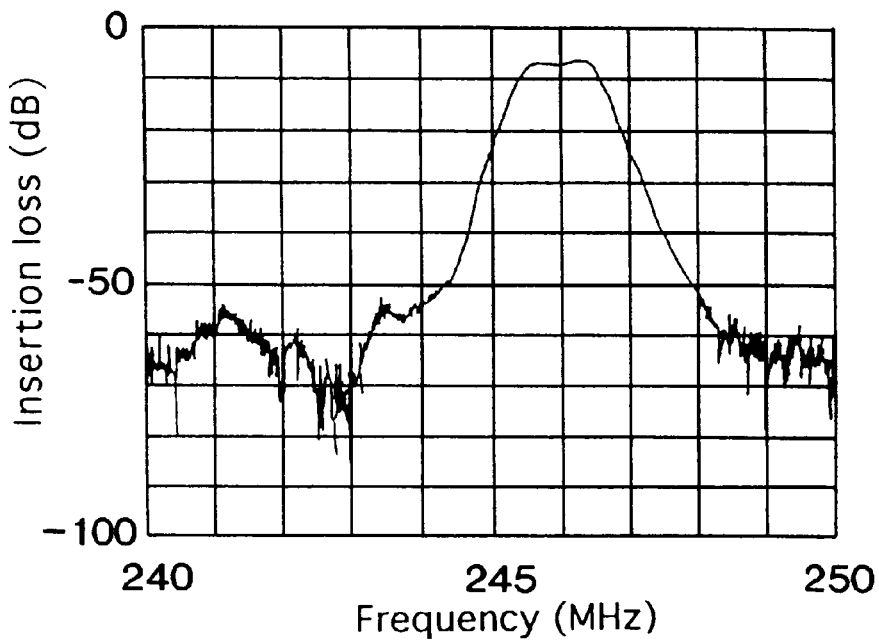
FIG. 17 is a graph showing bandpass characteristics of a filter of the fifth embodiment according to the present invention.
Figure 17B:
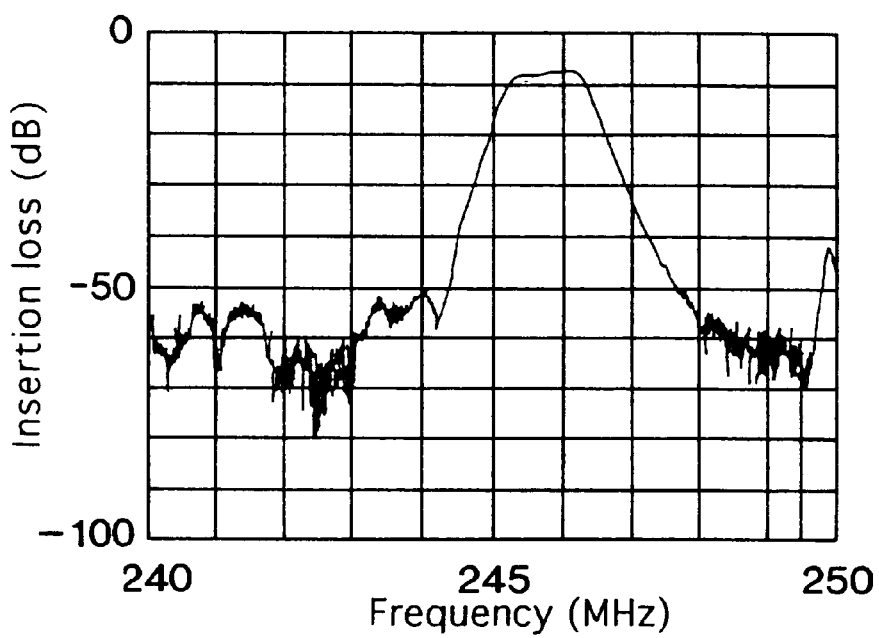

When the transverse-coupling type multimode filters prepared in the above design condition were connected in cascade, the passband characteristics are as shown in FIG. 17(a). As a comparison, the passband characteristics of the transverse-coupling type multimode filters prepared in the same condition as above on an ST-cut (42°-rotated Y-cut) quarts substrate are shown in FIG. 17(b). The passband width is 240 kHz in both cases. It is understood that, by providing a grating structure in the common bus bar, the passband width enlargement effect has been obtained irrespective of whether the filter is provided on an ST-cut quartz substrate or not.

Example 6

Figure 18:
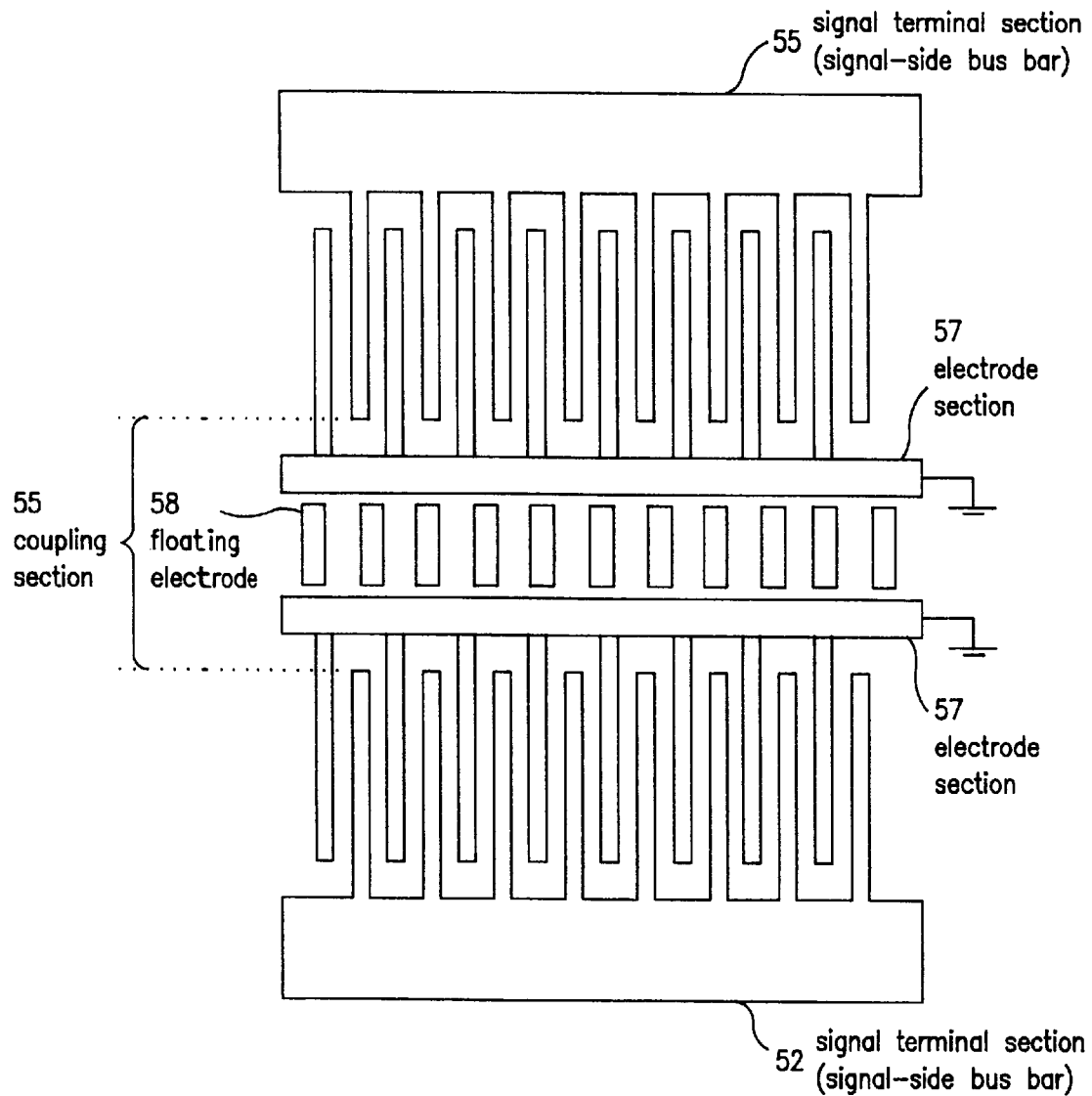
FIG. 18 is a view for showing a construction of a sixth embodiment of multimode surface acoustic wave filter according to the present invention.

FIG. 18 shows a construction of the Example 6 of the present invention. The construction of the coupling section in FIG. 18 is different from that of FIG. 1. Namely, the coupling section 55 in FIG. 18 includes two electrode sections 57 electrically insulated from each other and a plurality of floating electrodes 58 disposed in a space between the two electrode sections 57 and electrically insulated from each other, the floating electrodes 58 being arranged in the propagation direction of the surface acoustic waves.

For example, the coupling section 55 is constructed with the width of the two electrode sections 57 being 3.2 μm, the distance between the two electrode sections 57 being 10 μm, the width (e) of the floating electrodes 58 in the horizontal direction being 4.8 μm, the interval (f) between the floating electrodes 58 in the horizontal direction being 1.6 μm, and the length of the floating electrodes 58 in the vertical direction being 4.4 μm.

This Example also provides a multimode surface acoustic wave filter with a relative band width of about 0.12% similar to the one in Example 1.

Here, in view of the improvement in relative band width, it is preferable to allow the ratio (e/f) of the floating electrode width (e) to the floating electrode interval (f) to be larger than the ratio (d/c) of the interdigital electrode width (d) of IDT to the interdigital electrode interval (c) of IDT.

Figure 21:
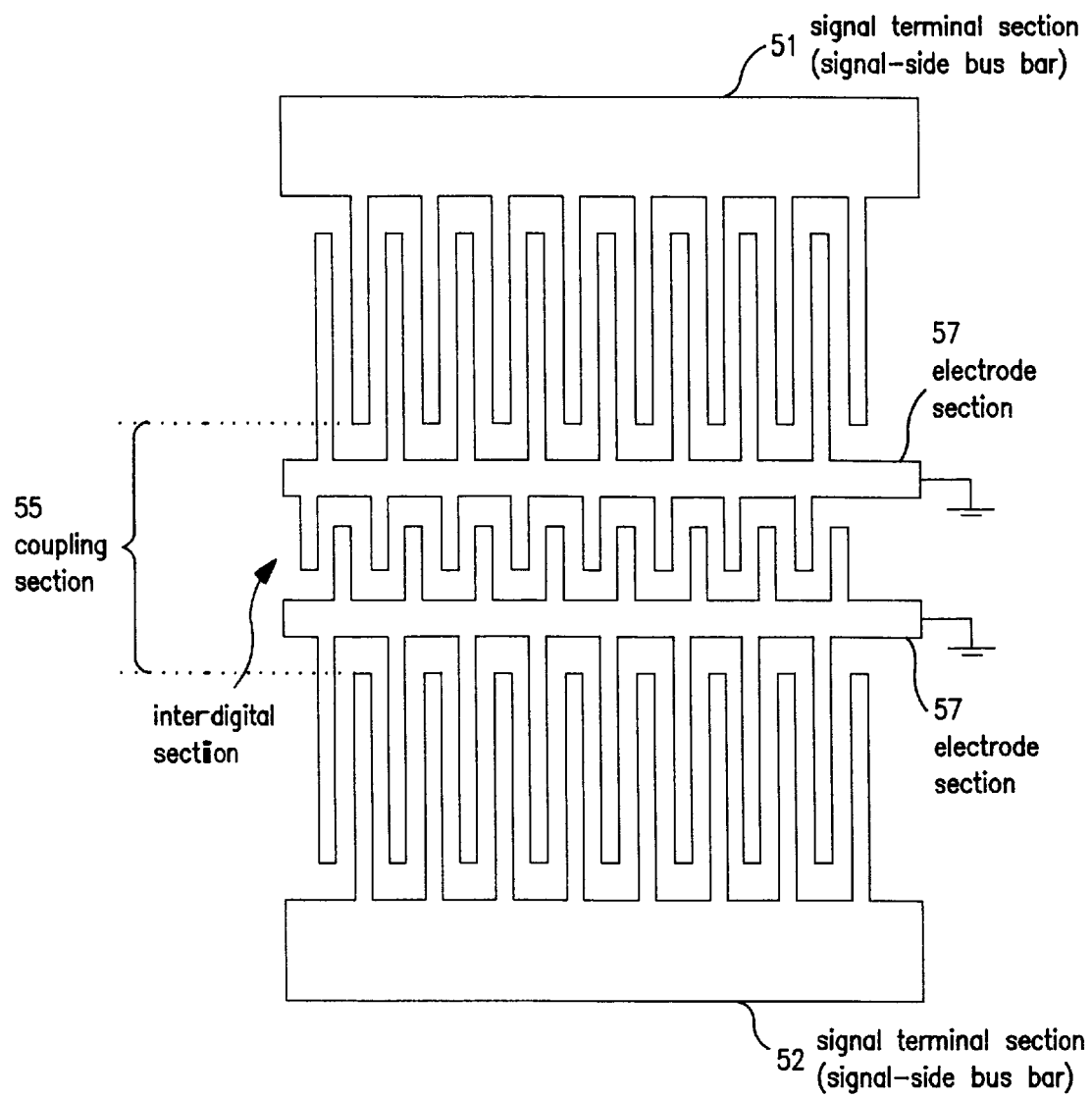
FIG. 21 is a view for showing a construction in which the coupling section is shaped like an interdigital pattern in a multimode surface acoustic wave filter of the present invention.
Figure 22:
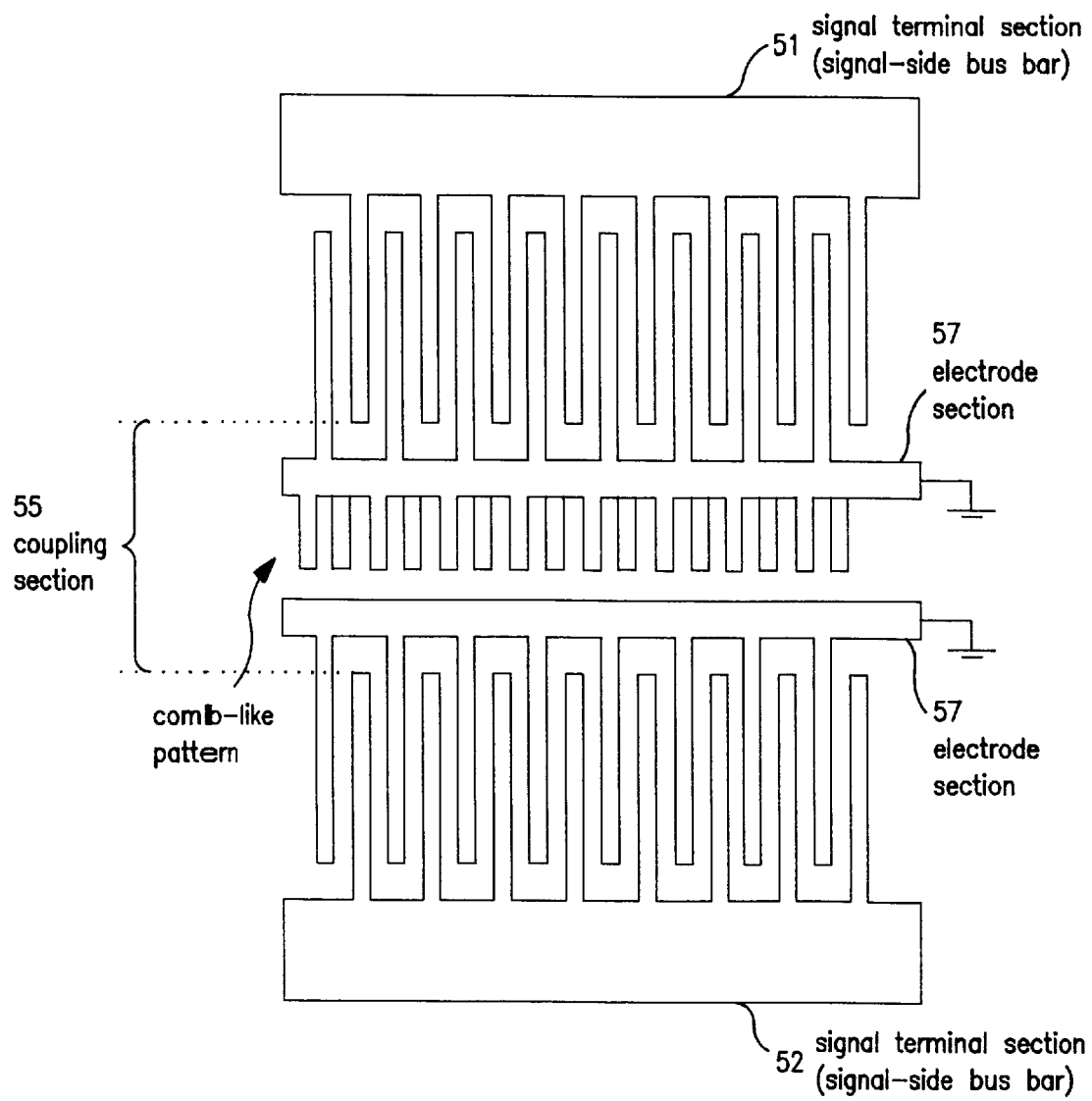
FIG. 22 is a view for showing a construction in which the coupling section is shaped like a comb-like pattern in a multimode surface acoustic wave filter of the present invention.

Also, the coupling section 55 may have a construction shown in FIG. 21 or FIG. 22.

FIG. 21 shows a case in which the coupling section 55 is shaped in an interdigital pattern. FIG. 22 shows a case in which the coupling section 55 is shaped in a comb-like pattern.

Further, the coupling section 55 of each multimode surface acoustic wave filter may be divided into two electrode sections 57, 57, as shown in FIG. 21 or FIG. 22, in a transverse-coupling type multimode filter including a plurality of multimode surface acoustic wave filters connected in cascade. In this case, by letting the electrode sections 57, 57 to be independently grounded as an input electrode and an output electrode, it is possible to increase the insertion loss outside the passband, thereby improving the filter characteristics.

Figure 23:
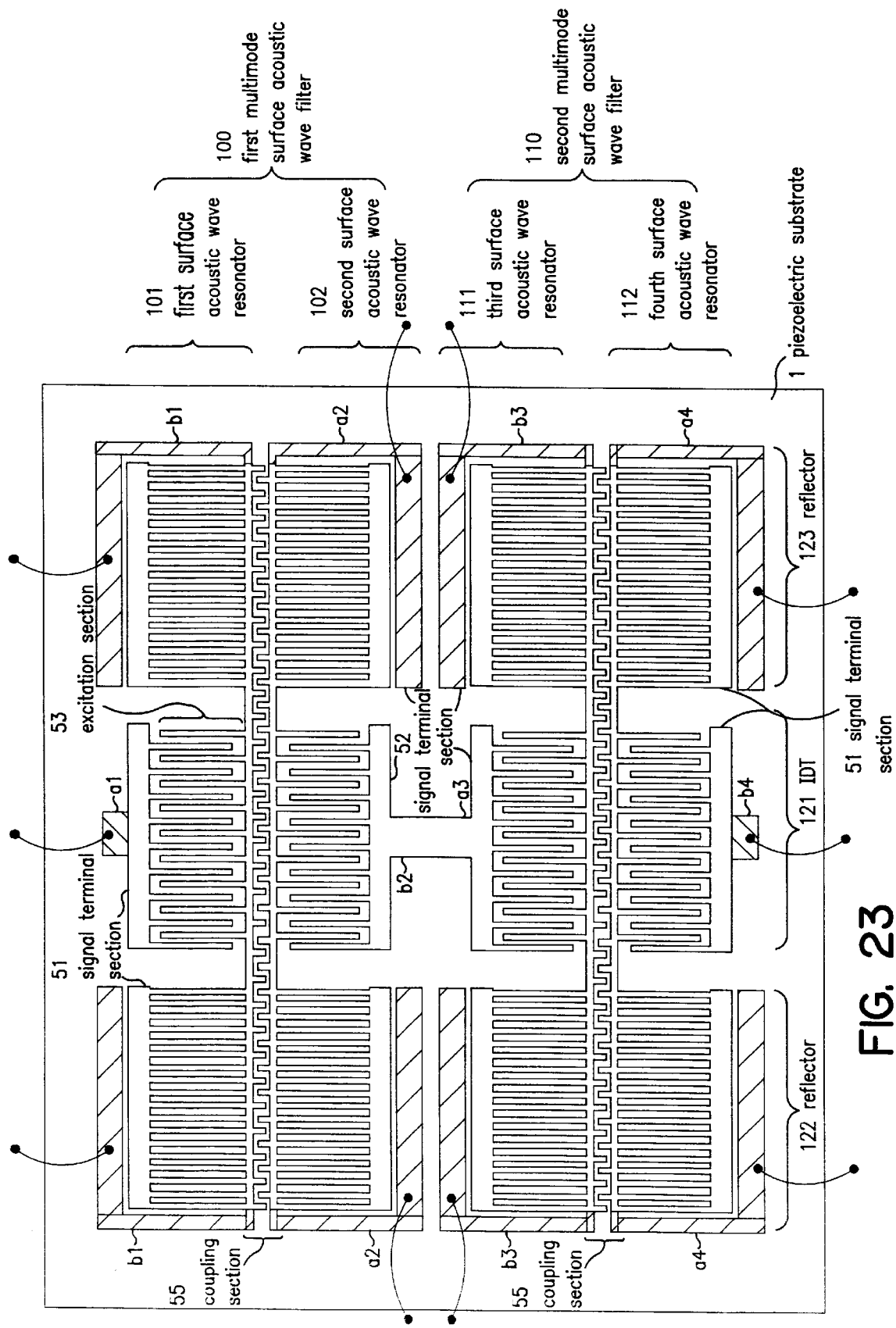
FIG. 23 is a view for showing a construction of an embodiment of a transverse-coupling type multimode filter including two transverse-coupling type multimode filters connected in cascade according to the present invention.
Figure 24:
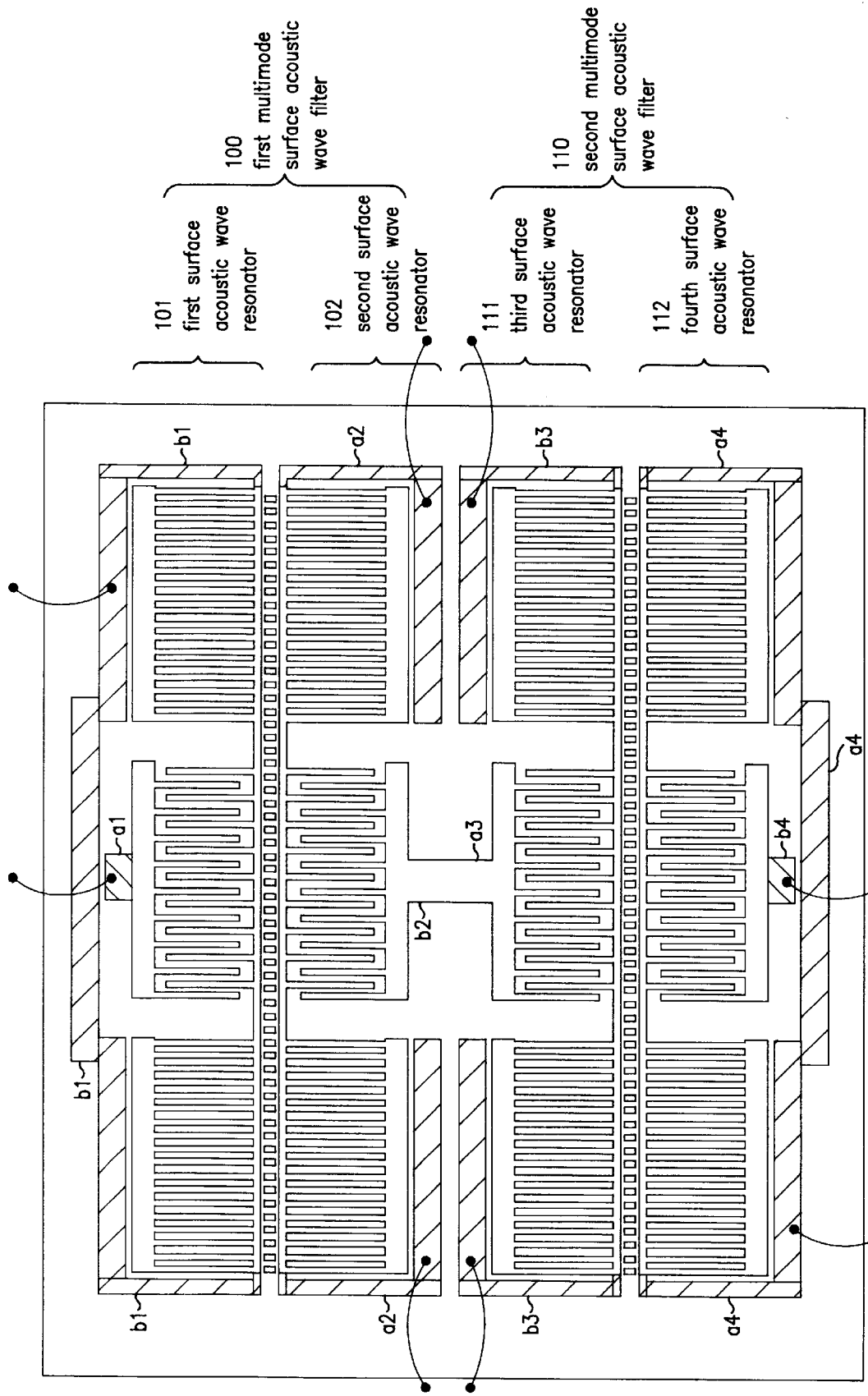
FIG. 24 is a view for showing a construction of an embodiment of a transverse-coupling type multimode filter including two transverse-coupling type multimode filters connected in cascade according to the present invention.

FIGS. 23 and 24 show embodiments of transverse-coupling type multimode filters including two transverse-coupling type multimode filters connected in cascade with the coupling section 55 being shaped in an interdigital pattern and a floating electrode pattern, respectively.

Referring to FIGS. 23 and 24, the first multimode surface acoustic wave filter 100 and the second multimode surface acoustic wave filter 110 are connected in cascade via a metal electrode film (b2, a3).

The first and second multimode surface acoustic wave filters 100, 110 are formed of the first and second surface acoustic wave resonators (101, 102) and the third and fourth surface acoustic wave resonators (111, 112), respectively.

Further, each of the surface acoustic wave resonators (101, 102, 111, 112) is formed of an IDT 121 and reflectors (122, 123).

Referring to FIG. 23, portions of the coupling section 55 extend in a direction parallel to the propagation direction of the surface acoustic waves to surround the reflectors 122, 123 corresponding to the coupling section 55.

The extending portions (a2, a4, b1, b3) serve as input and output terminals for outer circuits. Also, the portions a1, b4 of FIG. 23 are also input and output terminals for outer circuits.

FIG. 24 shows a construction in which the extending portions of the coupling section 55 as shown in FIG. 23 further surround the IDT 121 to be electrically connected.

The constructions shown in FIGS. 23 and 24 make it possible to fabricate unbalanced type and balanced type filters by allowing the portion bi or a4 to be a ground terminal or a signal terminal.

According to the present invention, by using a transverse-coupling type construction, a small multimode surface acoustic wave filter can be obtained having an enlarged passband width with a relative band width of about 0.1% and with less amount of spurious response outside the passband.

What we claim is:

1. A multimode surface acoustic wave filter comprising two surface acoustic wave resonators arranged on a piezoelectric substrate in a direction perpendicular to the propagation direction of surface acoustic waves and acoustically coupled by a coupling section, each of the surface acoustic wave resonators comprising an interdigital transducer and two reflectors disposed on both sides of the interdigital transducer in a direction parallel to the propagation direction of the surface acoustic waves, the interdigital transducer having an excitation section for exciting the surface acoustic waves and a signal terminal section for inputting or outputting an electrical signal, and each of the reflectors having a grating section and a terminal section, wherein the coupling section comprises a metal electrode having a plurality of slits arranged in the propagation direction of the surface acoustic wave, and the piezoelectric substrate is made of a material such that the velocity of SAW propagating through the coupling section is smaller in the case where the coupling section is formed of a metal electrode having a plurality of slits than in the case where the coupling section is formed of a uniform metal film.

2. A multimode surface acoustic wave filter comprising two surface acoustic wave resonators arranged on a piezoelectric substrate in a direction perpendicular to the propagation direction of surface acoustic waves and acoustically coupled by a coupling section, each of the surface acoustic wave resonators comprising an interdigital transducer and two reflectors disposed on both sides of the interdigital transducer in a direction parallel to the propagation direction of the surface acoustic waves, the interdigital transducer having an excitation section for exciting the surface acoustic waves and a signal terminal section for inputting or outputting an electrical signal, and each of the reflectors having a grating section and a terminal section, wherein the coupling section comprises a metal electrode having a plurality of slits arranged in the propagation direction of the surface acoustic wave, and the piezoelectric substrate comprises a rotated Y-cut quartz.

3. A multimode surface acoustic wave filter comprising a plurality of multimode surface acoustic wave filters according to claim 2, wherein the multimode surface acoustic wave filters are electrically connected in cascade via the signal terminal section of each interdigital transducer thereof.

4. A multimode surface acoustic wave filter according to claim 3, wherein the coupling section of each multimode surface acoustic wave filter is shaped in an interdigital pattern, a comb-like pattern or a pattern having insulated floating electrodes.

5. A multimode surface acoustic wave filter according to claim 3, wherein the coupling section of each multimode surface acoustic wave filter is divided into a plurality of segments, and the coupling section extends in a direction parallel to the propagation direction of the surface acoustic waves to surround the reflectors electrically connected to the coupling section.

6. A multimode surface acoustic wave filter according to claim 5, wherein the extending portion of the coupling section further surrounds at least a portion of the signal terminal section of the interdigital transducer.

7. A multimode surface acoustic wave filter according to claim 2, wherein the velocity of the surface acoustic waves propagating through the signal terminal section of the interdigital transducer is larger than the velocity of the surface acoustic waves propagating through the excitation section.

8. A multimode surface acoustic wave filter according to claim 7, wherein the signal terminal section comprises a metal electrode having a plurality of slits arranged in the propagation direction of the surface acoustic waves.

9. A multimode surface acoustic wave filter according to claim 8, wherein the excitation section of the interdigital transducer comprises a plurality of equally spaced electrode fingers, and the ratio (g/h) of the slit interval (g) to the slit width (h) of the signal terminal section is smaller than the ratio (d/c) of the width (d) to the interval (c) of the electrode fingers.

10. A multimode surface acoustic wave filter according to claim 7, wherein the signal terminal section comprises a metal electrode on which a mass loading material is superposed.

11. A multimode surface acoustic wave filter according to claim 2, wherein the coupling section comprises a metal electrode on which a mass loading material is superposed.

12. A multimode surface acoustic wave filter according to claim 2, wherein the relative band width of the filter is within the range of 0.06% to 0.12%.

13. A multimode surface acoustic wave filter comprising two surface acoustic wave resonators arranged on a piezoelectric substrate in a direction perpendicular to the propagation direction of surface acoustic waves and acoustically coupled by a coupling section, each of the surface acoustic wave resonators comprising an interdigital transducer and two reflectors disposed on both sides of the interdigital transducer in a direction parallel to the propagation direction of the surface acoustic waves, the interdigital transducer having an excitation section for exciting the surface acoustic waves and a signal terminal section for inputting or outputting an electrical signal, and each of the reflectors having a grating section and a terminal section, wherein the velocity of surface acoustic waves propagating through the coupling section is larger than the velocity of the surface acoustic waves propagating through the excitation section of the interdigital transducer, and wherein the coupling section is shaped in an interdigital pattern or a comb-like pattern.

14. A multimode surface acoustic wave filter according to claim 13, wherein the coupling section comprises a metal electrode on which a mass loading material is superposed.

15. A multimode surface acoustic wave filter according to claim 13, wherein the velocity of the surface acoustic waves propagating through the signal terminal section of the interdigital transducer is larger than the velocity of the surface acoustic waves propagating through the excitation section.

16. A multimode surface acoustic wave filter according to claim 13, wherein the piezoelectric substrate comprises a rotated Y-cut quartz.

17. A multimode surface acoustic wave filter comprising a plurality of multimode surface acoustic wave filters according to claim 13, wherein the multimode surface acoustic wave filters are electrically connected in cascade via the signal terminal section of each interdigital transducer thereof.

18. A multimode surface acoustic wave filter comprising two surface acoustic wave resonators arranged on a piezoelectric substrate in a direction perpendicular to the propagation direction of surface acoustic waves and acoustically coupled by a coupling section, each of the surface acoustic wave resonators comprising an interdigital transducer and two reflectors disposed on both sides of the interdigital transducer in a direction parallel to the propagation direction of the surface acoustic waves, the interdigital transducer having an excitation section for exciting the surface acoustic waves and a signal terminal section for inputting or outputting an electrical signal, and each of the reflectors having a grating section and a terminal section, wherein the velocity of surface acoustic waves propagating through the coupling section is larger than the velocity of the surface acoustic waves propagating through the excitation section of the interdigital transducer, and wherein the coupling section is formed of a ground terminal section comprising a uniform metal electrode film extending in the propagation direction of the surface acoustic waves and a plurality of slits arranged in the propagation direction of the surface acoustic waves, and the surface acoustic waves propagating through the signal terminal section and the ground terminal section have propagating velocities satisfying the following relation:

Vbus>Vcommon, wherein
Vbus: the propagation velocity of the surface acoustic waves propagating through the signal terminal section, and
Vcommon: the propagation velocity of the surface acoustic waves propagating through the ground terminal section.

19. A multimode surface acoustic wave filter according to claim 18, wherein the coupling section comprises a metal electrode on which a mass loading material is superposed.

20. A multimode surface acoustic wave filter according to claim 18, wherein the velocity of the surface acoustic waves propagating through the signal terminal section of the interdigital transducer is larger than the velocity of the surface acoustic waves propagating through the excitation section.

21. A multimode surface acoustic wave filter according to claim 18, wherein the piezoelectric substrate comprises a rotated Y-cut quartz.

22. A multimode surface acoustic wave filter comprising a plurality of multimode surface acoustic wave filters according to claim 18, wherein the multimode surface acoustic wave filters are electrically connected in cascade via the signal terminal section of each interdigital transducer thereof.

23. A multimode surface acoustic wave filter according to claim 18, wherein the coupling section comprises a metal electrode on which a mass loading material is superposed.

24. A multimode surface acoustic wave filter comprising two surface acoustic wave resonators arranged on a piezoelectric substrate in a direction perpendicular to the propagation direction of surface acoustic waves and acoustically coupled by a coupling section,
each of the surface acoustic wave resonators comprising an interdigital transducer and two reflectors disposed on both sides of the interdigital transducer in a direction parallel to the propagation direction of the surface acoustic waves,
the interdigital transducer having an excitation section for exciting the surface acoustic waves and a signal terminal section for inputting or outputting an electrical signal, and
each of the reflectors having a grating section and a terminal section,
wherein the velocity of surface acoustic waves propagating through the coupling section is larger than the velocity of the surface acoustic waves propagating through the excitation section of the interdigital transducer, and wherein the coupling section comprises two grounded electrode sections electrically insulated from each other and a plurality of floating electrodes disposed in a space between the two electrode sections and electrically insulated from each other, the floating electrodes being arranged in the propagation direction of the surface acoustic waves.

25. A multimode surface acoustic wave filter according to claim 24, wherein the coupling section comprises a metal electrode on which a mass loading material is superposed.

26. A multimode surface acoustic wave filter according to claim 24, wherein the velocity of the surface acoustic waves propagating through the signal terminal section of the interdigital transducer is larger than the velocity of the surface acoustic waves propagating through the excitation section.

27. A multimode surface acoustic wave filter according to claim 24, wherein the piezoelectric substrate comprises a rotated Y-cut quartz.

28. A multimode surface acoustic wave filter comprising a plurality of multimode surface acoustic wave filters according to claim 24, wherein the multimode surface acoustic wave filters are electrically connected in cascade via the signal terminal section of each interdigital transducer thereof.

29. A multimode surface acoustic wave filter according to claim 24, wherein the excitation section of the interdigital transducer comprises a plurality of equally spaced electrode fingers, and the ratio (e/f) of the width (e) to the interval (f) of the floating electrodes is larger than the ratio (d/c) of the width (d) to the interval (c) of the electrode fingers so that the velocity of the surface acoustic waves propagating through the coupling section is larger than the velocity of the surface acoustic waves propagating through the excitation section of the interdigital transducer.

30. A multimode surface acoustic wave filter comprising two surface acoustic wave resonators arranged on a piezoelectric substrate in a direction perpendicular to the propagation direction of surface acoustic waves and acoustically coupled by a coupling section,
each of the surface acoustic wave resonators comprising an interdigital transducer and two reflectors disposed on both sides of the interdigital transducer in a direction parallel to the propagation direction of the surface acoustic waves,
the interdigital transducer having an excitation section for exciting the surface acoustic waves and a signal terminal section for inputting or outputting an electrical signal, and
each of the reflectors having a grating section and a terminal section,
wherein the velocity of surface acoustic waves propagating through the coupling section is larger than the velocity of the surface acoustic waves propagating through the excitation section of the interdigital transducer, and wherein the surface acoustic waves propagating through the coupling section, the signal terminal section, and the excitation section have propagating velocities satisfying the following relation:

Vmetal>Vbus=Vgap>Vidt, wherein
Vbus: the propagation velocity of the surface acoustic waves propagating through the signal terminal section,
Vgap: the propagation velocity of the surface acoustic waves propagating through the coupling section,
Vidt: the propagating velocity of the surface acoustic waves propagating through the excitation section, and
Vmetal: the propagating velocity of the surface acoustic waves propagating through a uniform metal film formed of the same material and having the same thickness as the interdigital transducer.

31. A multimode surface acoustic wave filter according to claim 30, wherein the coupling section comprises a metal electrode on which a mass loading material is superposed.

32. A multimode surface acoustic wave filter according to claim 30, wherein the velocity of the surface acoustic waves propagating through the signal terminal section of the interdigital transducer is larger than the velocity of the surface acoustic waves propagating through the excitation section.

33. A multimode surface acoustic wave filter according to claim 30, wherein the piezoelectric substrate comprises a rotated Y-cut quartz.

34. A multimode surface acoustic wave filter comprising two surface acoustic wave resonators arranged on a piezoelectric substrate in a direction perpendicular to the propagation direction of surface acoustic waves and acoustically coupled by a coupling section, each of the surface acoustic wave resonators comprising an interdigital transducer and two reflectors disposed on both sides of the interdigital transducer in a direction parallel to the propagation direction of the surface acoustic waves, the interdigital transducer having an excitation section for exciting the surface acoustic waves and a signal terminal section for inputting or outputting an electrical signal, and each of the reflectors having a grating section and a terminal section, wherein the velocity of surface acoustic waves propagating through the coupling section is larger than the velocity of the surface acoustic waves propagating through the excitation section of the interdigital transducer, and wherein the surface acoustic waves propagating through the coupling section, the signal terminal section, and the excitation section have propagating velocities satisfying the following relation:

$$Vmetal > Vbus > Vgap > Vidt,$$

wherein
 Vbus: the propagation velocity of the surface acoustic waves propagating through the signal terminal section,
 Vgap: the propagation velocity of the surface acoustic waves propagating through the coupling section,
 Vidt: the propagating velocity of the surface acoustic waves propagating through the excitation section, and a uniform metal film formed of the same material, and
 Vmetal: the propagating velocity of the surface acoustic waves propagating through a uniform metal film formed of the same material and having the same thickness as the interdigital transducer.

35. A multimode surface acoustic wave filter according to claim 34, wherein the coupling section comprises a metal electrode on which a mass loading material is superposed.

36. A multimode surface acoustic wave filter according to claim 34, wherein the velocity of the surface acoustic waves propagating through the signal terminal section of the interdigital transducer is larger than the velocity of the surface acoustic waves propagating through the excitation section.

37. A multimode surface acoustic wave filter according to claim 34, wherein the piezoelectric substrate comprises a rotated Y-cut quartz.

38. A multimode surface acoustic wave filter comprising a plurality of multimode surface acoustic wave filters according to claim 34, wherein the multimode surface acoustic wave filters are electrically connected in cascade via the signal terminal section of each interdigital transducer thereof.

39. A multimode surface acoustic wave filter comprising two surface acoustic wave resonators arranged on a piezoelectric substrate in a direction perpendicular to the propagation direction of surface acoustic waves and acoustically coupled by a coupling section, each of the surface acoustic wave resonators comprising an interdigital transducer and two reflectors disposed on both sides of the interdigital transducer in a direction parallel to the propagation direction of the surface acoustic waves, the interdigital transducer having an excitation section for exciting the surface acoustic waves and a signal terminal section for inputting or outputting an electrical signal, and each of the reflectors having a grating section and a terminal section, wherein the velocity of surface acoustic waves propagating through the coupling section is larger than the velocity of the surface acoustic waves propagating through the excitation section of the interdigital transducer, and wherein the surface acoustic waves propagating through the coupling section, the signal terminal section, and the excitation section have propagating velocities satisfying the following relation:

$$Vmetal = Vbus > Vgap > Vidt,$$

wherein
 Vbus: the propagation velocity of the surface acoustic waves propagating through the signal terminal section,
 Vgap: the propagation velocity of the surface acoustic waves propagating through the coupling section,
 Vidt: the propagating velocity of the surface acoustic waves propagating through the excitation section, and
 Vmetal: the propagating velocity of the surface acoustic waves propagating through a uniform metal film formed of the same material and having the same thickness as the interdigital transducer.

40. A multimode surface acoustic wave filter according to claim 39, wherein the coupling section comprises a metal electrode on which a mass loading material is superposed.

41. A multimode surface acoustic wave filter according to claim 39, wherein the velocity of the surface acoustic waves propagating through the signal terminal section of the interdigital transducer is larger than the velocity of the surface acoustic waves propagating through the excitation section.

42. A multimode surface acoustic wave filter according to claim 39, wherein the piezoelectric substrate comprises a rotated Y-cut quartz.

43. A multimode surface acoustic wave filter comprising a plurality of multimode surface acoustic wave filters according to claim 39, wherein the multimode surface acoustic wave filters are electrically connected in cascade via the signal terminal section of each interdigital transducer thereof.

44. A multimode surface acoustic wave filter comprising two surface acoustic wave resonators arranged on a Piezoelectric substrate in a direction perpendicular to the propagation direction of surface acoustic waves and acoustically coupled by a coupling section, each of the surface acoustic wave resonators comprising an interdigital transducer and two reflectors disposed on both sides of the interdigital transducer in a direction parallel to the propagation direction of the surface acoustic waves, the interdigital transducer having an excitation section for exciting the surface acoustic waves and a signal terminal section for inputting or outputting an electrical signal, and each of the reflectors having a grating section and a terminal section, wherein the velocity of surface acoustic waves propagating through the coupling section is larger than the velocity of the surface acoustic waves propagating through the excitation section of the interdigital transducer, and wherein the surface acoustic waves propagating through the coupling section, the signal terminal section, and the excitation section have propagating velocities satisfying the following relation:

$$Vmetal > Vgap > Vbus > Vidt,$$

wherein
- Vbus: the propagation velocity of the surface acoustic waves propagating through the signal terminal section,
- Vgap: the propagation velocity of the surface acoustic waves propagating through the coupling section,
- Vidt: the propagating velocity of the surface acoustic waves propagating through the excitation section, and
- Vmetal: the propagating velocity of the surface acoustic waves propagating through a uniform metal film formed of the same material and having the same thickness as the interdigital transducer.

45. A multimode surface acoustic wave filter according to claim 44, wherein the coupling section comprises a metal electrode on which a mass loading material is superposed.

46. A multimode surface acoustic wave filter according to claim 44, wherein the velocity of the surface acoustic waves propagating through the signal terminal section of the interdigital transducer is larger than the velocity of the surface acoustic waves propagating through the excitation section.

47. A multimode surface acoustic wave filter according to claim 44, wherein the piezoelectric substrate comprises a rotated Y-cut quartz.

48. A multimode surface acoustic wave filter comprising a plurality of multimode surface acoustic wave filters according to claim 44, wherein the multimode surface acoustic wave filters are electrically connected in cascade via the signal terminal section of each interdigital transducer thereof.

49. A multimode surface acoustic wave filter comprising two surface acoustic wave resonators arranged on a piezoelectric substrate in a direction perpendicular to the propagation direction of surface acoustic waves and acoustically coupled by a coupling section, each of the surface acoustic wave resonators comprising an interdigital transducer and two reflectors disposed on both sides of the interdigital transducer in a direction parallel to the propagation direction of the surface acoustic waves, the interdigital transducer having an excitation section for exciting the surface acoustic waves and a signal terminal section for inputting or outputting an electrical signal, and each of the reflectors having a grating section and a terminal section, wherein the velocity of surface acoustic waves propagating through the coupling section is larger than the velocity of the surface acoustic waves propagating through the excitation section of the interdigital transducer, and wherein the coupling section comprises a metal electrode having a plurality of slits arranged in the propagation direction of the surface acoustic wave, and the excitation section of the interdigital transducer comprises a plurality of equally spaced electrode fingers, and the ratio (a/b) of the slit interval (a) to the slit width (b) of the coupling section is larger than the ratio (d/c) of the width (d) to the interval (c) of the electrode fingers so that the velocity of the surface acoustic waves propagating through the coupling section is larger than the velocity of the surface acoustic waves propagating through the excitation section of the interdigital transducer.

* * * * *